US010218372B1

(12) United States Patent
Farley et al.

(10) Patent No.: US 10,218,372 B1
(45) Date of Patent: Feb. 26, 2019

(54) METHOD TO DETECT BLOCKER SIGNALS IN INTERLEAVED ANALOG-TO-DIGITAL CONVERTERS

(71) Applicant: Xilinx, Inc., San Jose, CA (US)

(72) Inventors: Brendan Farley, Donabate (IE); Christophe Erdmann, Dublin (IE); John E. McGrath, Cahir (IE); Bruno Miguel Vaz, Sao Domingos de Rana (PT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/939,257

(22) Filed: Mar. 28, 2018

(51) Int. Cl.
*H03M 1/10* (2006.01)

(52) U.S. Cl.
CPC .................. *H03M 1/1023* (2013.01)

(58) Field of Classification Search
CPC ...... H03M 1/1023; H03M 1/365; H03M 1/00; H03M 1/12
USPC ................. 341/120, 118, 155, 122, 159, 110
See application file for complete search history.

(56) References Cited

U.S. PATENT DOCUMENTS

| | | | |
|---|---|---|---|
| 8,730,072 B2* | 5/2014 | Petigny | H03M 1/1061 341/120 |
| 8,830,094 B1 | 9/2014 | Erdmann | |
| 9,166,608 B1* | 10/2015 | Deguchi | H03M 1/0604 |
| 9,294,112 B1* | 3/2016 | Devarajan | H03M 1/121 |
| 9,584,145 B1 | 2/2017 | Shin et al. | |
| 2011/0188617 A1* | 8/2011 | Eklund | H03M 1/08 375/346 |
| 2013/0106631 A1* | 5/2013 | Petigny | H03M 1/1061 341/120 |

\* cited by examiner

*Primary Examiner* — Jean B Jeanglaude
(74) *Attorney, Agent, or Firm* — Yipeng Li; William T. Paradice

(57) ABSTRACT

A time-skew adjustment circuit includes an input to receive a series of samples of an input signal from a plurality of channels of an interleaved ADC. A first subtractor calculates distances between consecutive samples in the received series of samples, and a plurality of average circuit code and a plurality of memory banks to calculate a plurality of first average distance, each corresponding to an average of the distance between consecutive samples from a respective pair of channels of the interleaved ADC. Time-skew detection circuitry calculates respective time skews between each of the pairs of channels by comparing each of the first average distances with an average of the distances between consecutive samples from the plurality of channels. Divergence control circuitry determines an accuracy of the time skews based at least in part on the first average distances and a Nyquist zone associated with the input signal.

20 Claims, 11 Drawing Sheets

METHOD TO DETECT BLOCKER SIGNALS IN INTERLEAVED ANALOG-TO-DIGITAL CONVERTERS

TECHNICAL FIELD

Aspects of the present disclosure generally relate to integrated circuits, and specifically to interleaved analog-to-digital converters (ADCs) used in integrated circuit technology.

BACKGROUND

Modern applications using analog-to-digital converters (ADCs) require an increasing amount of bandwidth. One way to achieve increased bandwidth without appreciable increase in power consumption is to utilize interleaved ADCs (i.e., two or more ADCs having a defined clocking relationship that are used to simultaneously sample an input signal and produce a combined output signal). The output signal of a set of interleaved ADCs results in a sampling bandwidth that is some multiple of the sample bandwidths of the individual ADCs. Thus, the effective sampling rate can be increased by a factor that is equal to the number of ADCs implemented. For example, using two ADCs each having a sample rate of $f_s$ will result in a sampling bandwidth of $2*f_s$.

Mismatch of the different interleaved channels can undesirably negate some of the benefits obtained by interleaving. For instance, time skew mismatch may be a significant limiting factor when increase bandwidth is desired. Time skew mismatch occurs when the sampling intervals of the interleaved channels are unequal. Consider the case of a two-channel interleaved ADC. The interval between when channel 1 first samples an input signal and when channel 2 first samples the input signal should be equal to the interval between when channel 2 first samples the input signal and when channel 1 samples the input signal for the second time. If these intervals are not equal, a time skew mismatch exists on at least one of the channels. The difference between the two intervals is proportional to an amount of time-skew error.

Conventional time-skew extraction techniques use a combination of multipliers and adders. This approach increases the amount of digital resources required, as well as the power consumption of the interleaved ADCs, particularly when dealing with a large number of interleaved channels. Conventional time-skew extraction techniques also require the use of notch filters to work at certain frequencies.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to interleaved analog-to-digital converters (ADCs) and methods of their operation. An example time-skew adjustment circuit includes an input to receive a series of samples of an input signal from a plurality of channels of an interleaved ADC. A first subtractor calculates distances between consecutive samples in the received series of samples, and a plurality of averaging circuits calculate a plurality of first average distances, each corresponding to an average of the distance between consecutive samples from a respective pair of channels of the interleaved ADC. Time-skew detection circuitry calculates respective time skews between each of the pairs of channels by comparing each of the first average distances with an average of the distances between consecutive samples from the plurality of channels. Divergence control circuitry determines an accuracy of the time skews based at least in part on the first average distances and a Nyquist zone associated with the input signal.

In some embodiments, the time-skew adjustment circuit may further include a calibration loop controller to selectively apply a timing offset to one or more channels of the interleaved ADC based at least in part on the time skews. In some aspects, the divergence control circuitry may be configured to determine the accuracy of the time skew calculated for a first pair of channels of the interleaved ADC based at least in part on a first timing offset applied by the calibration loop controller to at least one of the channels in the first pair.

In some embodiments, the divergence control circuitry may be configured to calculate a change in the first average distance for the first pair of channels in response to the first timing offset. The divergence control circuitry may then determine the accuracy of the time skew calculated for the first pair of channels based at least in part on a polarity of the change in the first average distance for the first pair of channels. In some other embodiments, the divergence control circuitry may determine the Nyquist zone associated with the input signal based at least in part on the polarity of the change in the first average distance for the first pair of channels.

In some embodiments, the divergence control circuitry may be configured to determine an expected polarity of change in the first average distance, in response to the first timing offset, based at least in part on the Nyquist zone associated with the input signal. The divergence control circuitry may then compare the polarity of the change in the first average distance with the expected polarity of change. In some embodiments, the divergence control circuitry may suspend an operation of the interleaved ADC when the polarity of the change in the first average distance is not the same as the expected polarity of change. In some other embodiments, the divergence control circuitry may prevent the calibration loop controller from applying the timing offset to one or more channels of the interleaved ADC when the polarity of the change in the first average distance is not the same as the expected polarity of change.

In some aspects, the expected polarity of change may correspond to a first polarity when the input signal is associated with an odd Nyquist zone, and may correspond to second polarity when the input signal is associated with an even Nyquist zone. In some other aspects, the expected polarity of change may correspond to a reduction in the first average distance when the input signal is associated with an odd Nyquist zone, and may correspond to an increase in the first average distance when the input signal is associated with an even Nyquist zone.

An example method disclosed herein may be used to operate a time-skew adjustment circuit for an interleaved ADC. The method may include receiving a series of samples of an input signal from a plurality of channels of an interleaved ADC; calculating distances between consecutive samples in the received series of samples; calculating a plurality of first average distances, wherein each of the first average distances corresponds to an average of the distance between consecutive samples from a respective pair of channels of the interleaved ADC; calculating respective time skews between each of the pairs of channels by comparing each of the first average distances with an average of the distances between consecutive samples from the plurality of channels; and determining an accuracy of the time skews based at least in part on the first average distances and a Nyquist zone associated with the input signal.

In some embodiments, the method may further include selectively applying a timing offset to one or more channels of the interleaved ADC based at least in part on the time skews. In some aspects, the step of determining the accuracy of the time skews may include a step of determining the accuracy of the time skew calculated for a first pair of channels of the interleaved ADC based at least in part on a first timing offset applied to at least one of the channels in the first pair.

In some embodiments, the step of determining the accuracy of the time skews may include steps of calculating a change in the first average distance for the first pair of channels in response to the first timing offset; and determining the accuracy of the time skew calculated for the first pair of channels based at least in part on a polarity of the change in the first average distance for the first pair of channels. In some other embodiments, the method may further include determining the Nyquist zone associated with the input signal based at least in part on the polarity of the change in the first average distance for the first pair of channels.

In some embodiments, the step of determining the accuracy of the time skews may include steps of determining an expected polarity of change in the first average distances, in response to the first timing offset, based at least in part on the Nyquist zone associated with the input signal; and comparing the polarity of the change in the first average distance with the expected polarity of change. In some embodiments, the method may further include suspending an operation of the interleaved ADC when the polarity of the change in the first average distance is not the same as the expected polarity of change. In some other embodiments, the method may further include preventing the calibration loop controller from applying the timing offset to one or more channels of the interleaved ADC when the polarity of the change in the first average distance is not the same as the expected polarity of change.

In some aspects the expected polarity of change may correspond to a first polarity when the Nyquist zone associated with the input signal is an odd Nyquist zone, and may correspond to a second polarity when the input signal is associated with an even Nyquist zone. In some other aspects, the expected polarity of change corresponds to a reduction in the first average distance when the input signal is associated with an odd Nyquist zone, and may correspond to an increase in the first average distance when the input signal is associated with an even Nyquist zone.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

Figure 1:
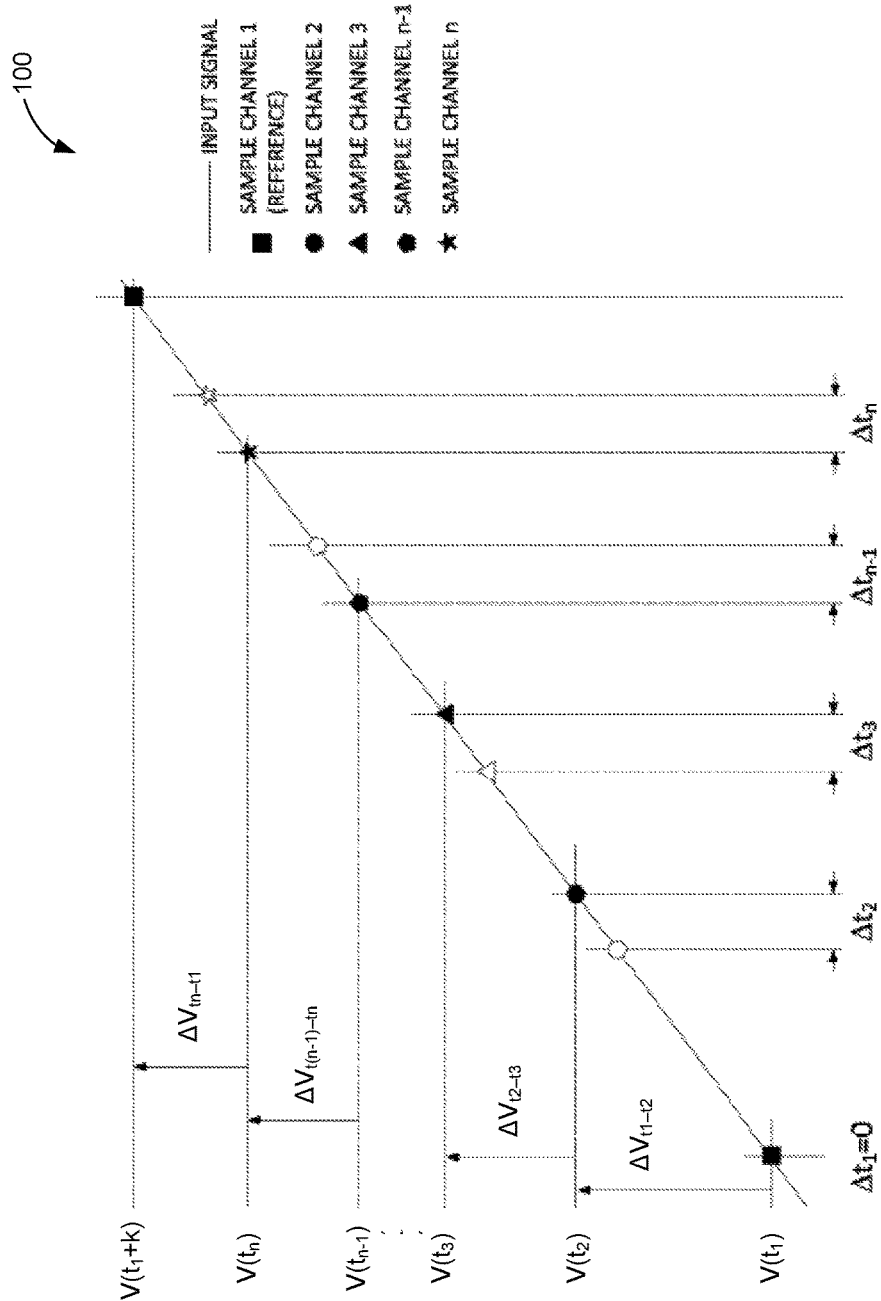
FIG. 1 shows a graph depicting an example sampling of an input signal by an interleaved analog-to-digital converter (ADC).

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

As described above, the performance of an interleaved ADC may be limited by time skew mismatch between the interleaved channels of the ADC, which operate on separate clocks. Conventional time-skew extraction solutions utilize a combination of adders and multipliers, which undesirably increases the power consumption of the integrated circuit. In some embodiments, time-skew extraction may be accomplished while conserving power by using subtractor circuitry (e.g., in lieu of multipliers and adders). More specifically, aspects of the present disclosure may obviate the use of multipliers, for time-skew extraction, which typically consume significant resources. For example, the interleaved absolute values of odd and even signal derivates may be compared and used to extract an average distance of the signal samples over time. This average distance may be proportional to the time skew and may thus be used to calibrate the interleaved ADC to correct for time-skew mismatch.

In some embodiments, a calibration loop controller may be used to adjust the timing of the interleaved ADC to correct for time-skew mismatch. For example, the calibration loop controller may adjust (e.g., delay) the timing at which samples are taken by individual channels of the interleaved ADC in an attempt to "equalize" the average distances between consecutive samples of the input signal. Because the sampled data provides the feedback for the time-skew adjustments, the accuracy with which the calibration loop controller is able to correct for time-skew mismatch may depend on the quality of the received input signal. More specifically, noise and/or interference in the communications channel may hinder the ability of the time-skew extraction circuitry to accurately measure the amount of time-skew between adjacent channels of the interleaved ADC. Ideally, the average distance between consecutive samples from each pair of channels should converge to an average distance taken across all of the pairs of channels. However, significant noise and/or interference in the communications channel may cause the average distances to diverge, which may render subsequent samples of the input signal unusable.

Aspects of the present disclosure may improve the performance of an interleaved ADC by detecting conditions in the time-skew adjustment operation that may cause the operation to diverge. In some embodiments, a time-skew adjustment circuit may include time skew detection circuitry to calculate respective time skews between each pair of channels of the interleaved ADC, and a divergence control circuitry to determine an accuracy of the time skews based at least in part on a Nyquist zone associated with the input signal. For example, the time-skew detection circuitry may calculate the respective time skews based at least in part on the average distances between consecutive samples from each pair of channels. Applying a time-skew adjustment (or correction) may change the average distance between consecutive samples for a particular pair of channels. More specifically, aspects of the present disclosure recognize that the polarity of the change in average distance (e.g., in response to a time-skew adjustment) may depend on the target Nyquist zone in which the input signal is expected to be located. For example, when the interleaved ADC samples the input signal from an odd Nyquist zone, the time-skew adjustments may cause a change in average distance between consecutive samples that is opposite in polarity to the change that would be caused if the interleaved ADC were to sample the input signal from an even Nyquist zone. Accordingly, the divergence control circuitry may predict, based on the Nyquist zone associated with the input signal, whether the time-skew adjustment operation is likely to diverge.

FIG. 1 shows a graph 100 depicting an example sampling of an input signal by an interleaved analog-to-digital converter (ADC). In the example of FIG. 1, the interleaved ADC includes a number (n) of sample channels configured to sample the input signal at different times. More specifically, each sample channel may comprise a respective "slice" of the interleaved ADC. As described in greater detail below, each ADC slice may operate as an independent analog-to-digital converter having a sampling frequency equal to $f_s/n$ (where $f_s$ is the overall sampling frequency of the interleaved ADC).

As shown in FIG. 1, the first sample channel (e.g., sample channel 1) of the interleaved ADC captures its first sample $V(t_1)$ of the input signal at a first instance of time $t_1$. For example, the first instance of time $t_1$ may coincide with a first transition of a first clock signal. Subsequently, the second sample channel (e.g., sample channel 2) of the interleaved ADC captures its first sample $V(t_2)$ of the input signal at a second instance of time $t_2$. For example, the second instance of time $t_2$ may coincide with a first transition of a second clock signal. It is noted that, while $V(t_2)$ may be the first sample taken by sample channel 2, it also represents the second consecutive sample (e.g., after $V(t_1)$) of the input signal. The remaining sample channels continue to sample the input signal, in order, until the $n^{th}$ sample channel (e.g., sample channel n) captures its first sample $V(t_n)$ of the input signal at the $n^{th}$ instance of time $t_n$. After sample channel n has taken its first sample, the first sample channel may subsequently capture its second sample $V(t_1+k)$ of the input signal at an $(n+1)^{th}$ instance of time $t_1+k$ (where k represents a sampling period of the interleaved ADC). For example, the $(n+1)^{th}$ instance of time $t_1+k$ may coincide with a second transition of the first clock signal.

Ideally, the "distance" (e.g., time difference) between each pair of consecutive sample channels' samples should be equal. For example, the distance ($\Delta V_{t1-t2}$) between the first sample channel's first sample and the second channel's first sample should be equal to the distance ($\Delta V_{t2-t3}$) between the second channel's first sample and the third sample channel's first sample (e.g., $\Delta V_{t1-t2} = \Delta V_{t2-t3}$). However, in the example of FIG. 1, the distance between consecutive samples from sample channels 1 and 2 is significantly greater than the distance between consecutive samples from sample channels 2 and 3 (e.g., $\Delta V_{t1-t2} > \Delta V_{t2-t3}$). Aspects of the present disclosure recognize that the difference between these two distances is proportional to the time-skew error ($\Delta t$) in the second sample channel. For example, the first sample taken by the second sample channel may be late by $\Delta t_2$, the first sample taken by the third sample channel may be late by $\Delta t_3$, the first sample taken by the $(n-1)^{th}$ sample channel may be early by $\Delta t_{n-1}$, and the first sample taken by the $n^{th}$ sample channel may be early by $\Delta t_n$.

Figure 2:
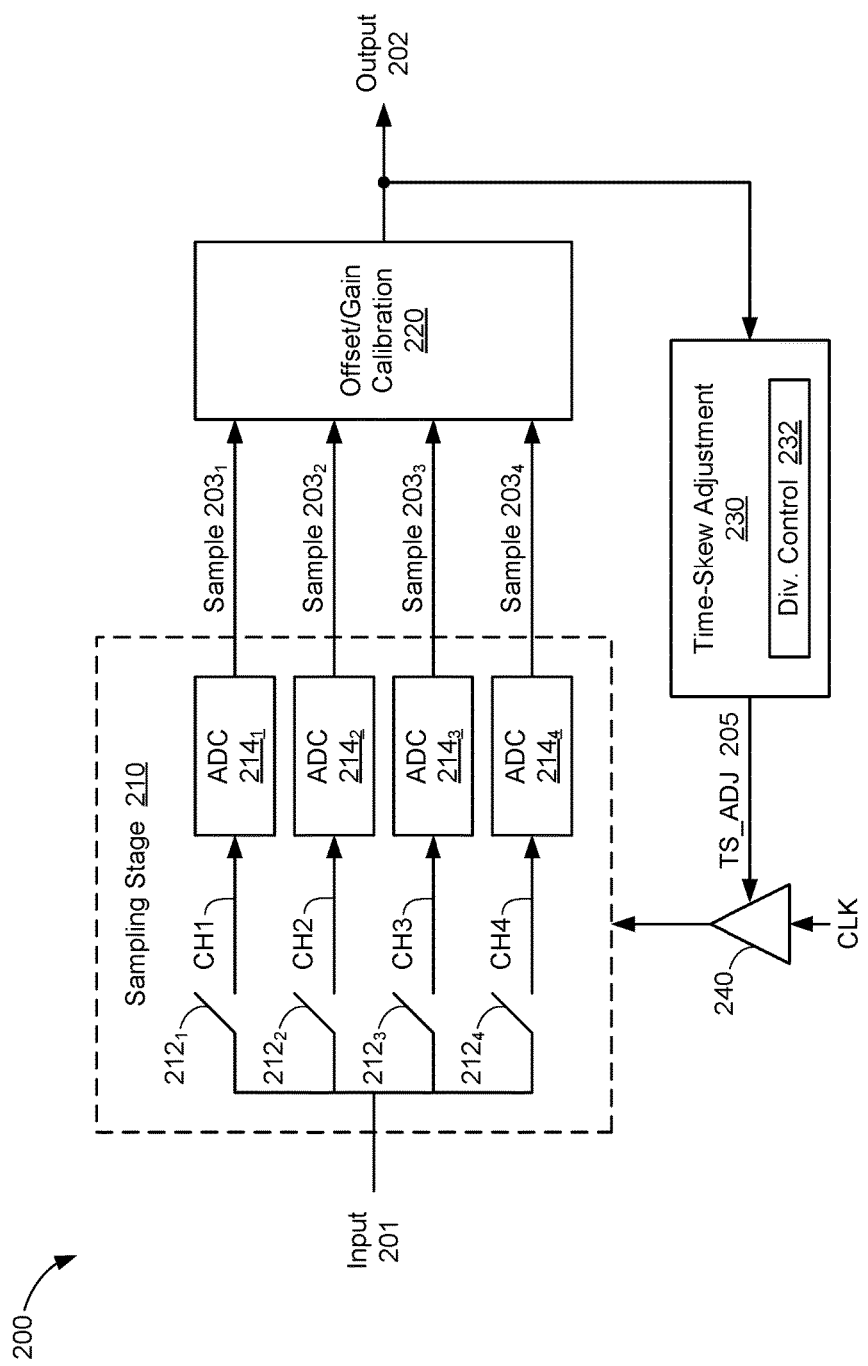
FIG. 2 shows an example block diagram of an interleaved ADC with time-skew adjustment circuitry, in accordance with some embodiments.

FIG. 2 shows an example block diagram of an interleaved ADC 200 with time-skew adjustment circuitry, in accordance with some embodiments. The interleaved ADC 200 includes a sampling stage 210, an offset/gain calibration circuit 220, and a time-skew adjustment circuit 230. The sample stage 210 includes a plurality of sample channels CH1-CH4. In the example of FIG. 2, the sampling stage 210 is shown to include only four sample channels CH1-CH4. However, in actual implementations, the sampling stage 210 may include fewer or more channels than those depicted in FIG. 2. The interleaved ADC 200 may be configured to receive an input signal 201, and to sample the input signal 201 at a sampling frequency $f_s$ to produce a digital output 202 representative of the input signal.

The sampling stage 210 may be configured to sample the input signal 201 based, at least in part, on a clock signal (CLK). For example, the sample stage 210 may include a plurality of ADC slices $214_1$-$214_4$ coupled to receive the input signal 201 via respective sampling switches $212_1$-$212_4$. More specifically, each of the ADC slices $214_1$-$214_4$ (and corresponding switches $212_1$-$212_4$) may comprise a respective channel $CH_1$-$CH_4$ of the sampling stage 210.

Thus, digital samples $203_1$ captured by the first slice $214_1$ correspond to a sampling performed in the first channel CH1 of the sampling stage 210, digital samples $203_2$ captured by the second slice $214_2$ correspond to a sampling performed in the second channel CH2 of the sampling stage 210, digital samples $203_3$ captured by the third slice $214_3$ correspond to a sampling performed in the third channel CH3 of the sampling stage 210, and digital samples $203_4$ captured by the fourth slice $214_4$ correspond to a sampling performed in the fourth channel CH4 of the sampling stage 210.

Each of the ADC slices $214_1$-$214_4$ samples the input signal 201 at a sampling frequency $f_s/4$ to produce a plurality of digital samples $203_1$-$203_4$. The digital samples $203_1$-$203_4$ are then filtered via the offset/gain calibration circuit 220 to produce the digital output 202. The sampling switches $212_1$-$212_4$ are configured to couple the input signal 201 to the ADC slices $214_1$-$214_4$, respectively, when it is time for each ADC slice to capture a respective sample of the input signal 201. In some embodiments, the opening and/or closing of the sampling switches $212_1$-$212_4$ may be controlled by the clock signal CLK. Ideally, the timing of the sampling switches $212_1$-$212_4$ may be aligned so that each of the ADC slices $214_1$-$214_4$ receives the input signal 201 with the same amount of delay and/or timing offset. For example, once the first slice $214_1$ has received the input signal 201, the second slice $214_2$ should receive the input signal 201 after an amount of time (at) has passed. Similarly, once the second slice $214_2$ has received the input signal 201, the third slice $214_3$ should receive the input signal 201 after the same amount of time Δt has passed. However, in actual implementations, there may be a mismatch between the routing of the input signal 201 via the different switches $212_1$-$212_4$ (e.g., due to process variations). This may result in time-skew mismatches, such as shown in FIG. 1.

The time-skew adjustment circuit 230 may detect time-skew mismatches between the channels CH1-CH4 of the sampling stage 210 based at least in part on the output signal 202. In some embodiments, the time-skew adjustment circuit 230 may further correct for time-skew mismatches between the various channels CH1-CH4 by adjusting the timing of the sampling switches $212_1$-$212_4$. For example, the time-skew adjustment circuit 230 may adjust the timing of the sampling switches $212_1$-$212_4$ by selectively delaying the clock signal CLK (e.g., which controls a timing of the sampling switches $212_1$-$212_4$) via a programmable delay stage 240. In some aspects, the timing adjustments may be output by the time-skew adjustment circuit 230 as a time-skew adjustment (TS_ADJ) signal 203. With reference for example to FIG. 1, the time-skew adjustment circuit 230 may reduce the amount of time-skew between the timing of the first sample and the timing of the second sample (e.g., $\Delta V_{t1-t2}$) by reducing the amount of delay between clock signals applied to the first sampling switch $212_1$ and clock signals applied to the second sampling switch $212_2$.

In some embodiments, the time-skew adjustment circuit 230 may use subtractor circuitry (e.g., in lieu of multipliers and adders) to extract the amount of time-skew between pairs of channels in the sampling stage 210. However, noise and/or interference in the communications channel may hinder the ability of the time-skew adjustment circuit 230 to accurately measure the amount of time-skew between adjacent channels of the interleaved ADC. As described in greater detail below, the time-skew adjustment circuit 230 may compare the interleaved absolute values of odd and even signal derivatives to extract an average distance between consecutive samples of the input signal 201 over time (e.g., which may be proportional to the amount of time skew). Ideally, the average distance between consecutive samples from each pair of channels should converge to an average distance that is the substantially the same across all of the pairs of channels. However, noise and/or interference in the communications channel (such as the presence of blockers and/or spectral artifacts) may cause the average distances to diverge over time, which may render subsequent samples of the input signal 201 (e.g., by the sampling stage 210) more and more unusable.

In some embodiments, the time-skew adjustment circuit 230 may include divergence control circuitry 232 to detect one or more conditions that may cause the average distances between consecutive samples of the input signal 201 to diverge (e.g., in response to timing adjustments applied by the time-skew adjustment circuit 230). More specifically, in some aspects, the time-skew adjustment circuit 230 may predict, based on a Nyquist zone associated with the input signal, whether the time-skew adjustment operation is likely to diverge. In some other aspects, the time-skew adjustment circuit 230 may determine the Nyquist zone associated with the input signal by monitoring a polarity of change in the average distances between consecutive samples of the input signal 201.

Figure 3:
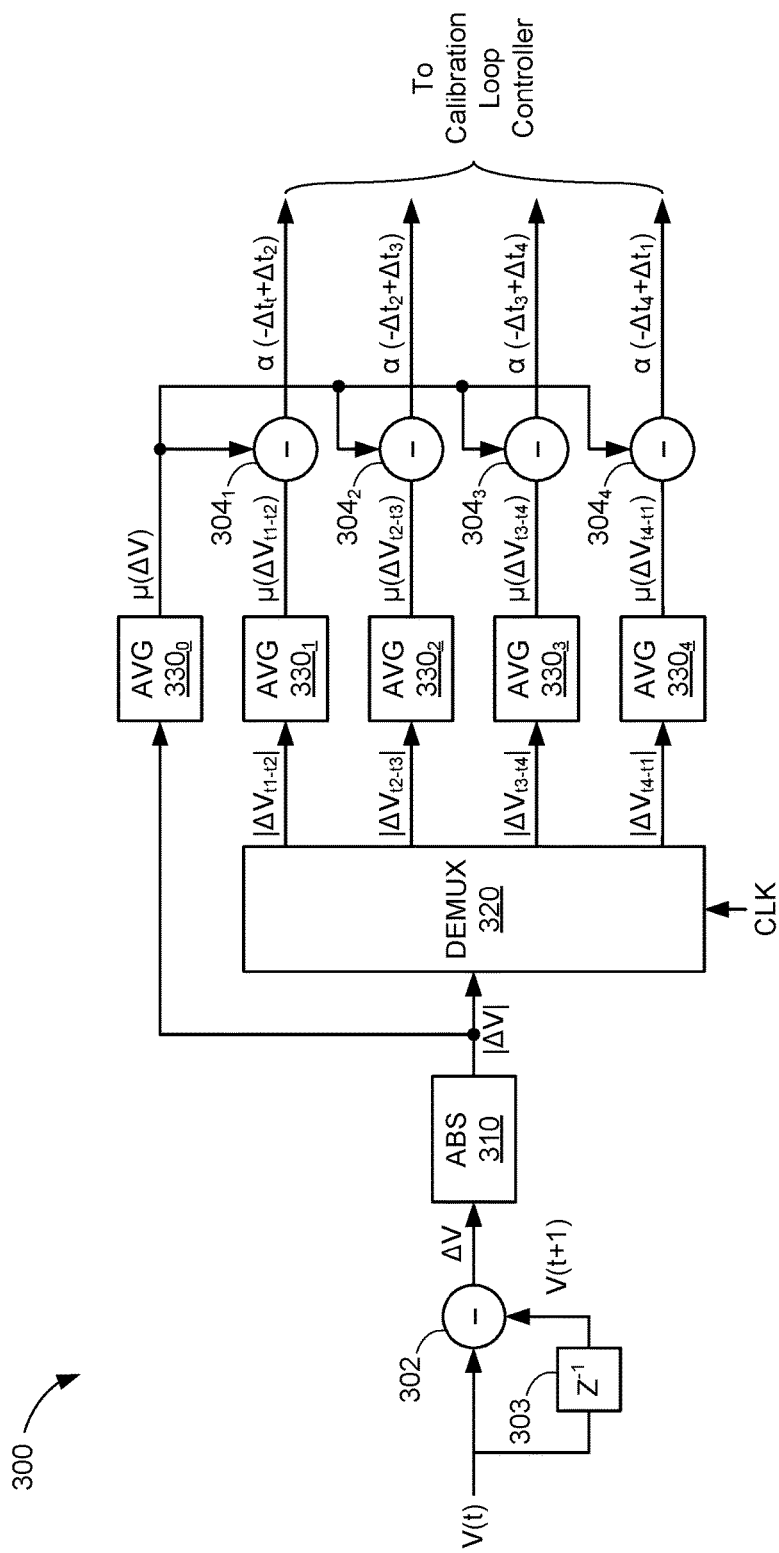
FIG. 3 shows an example block diagram of a time-skew extractor circuit, in accordance with some embodiments.

FIG. 3 shows an example block diagram of a time-skew extractor circuit 300, in accordance with some embodiments. The time-skew extractor circuit 300 may be an example embodiment of at least a portion of the time-skew adjustment circuit 230 of FIG. 2. In the example of FIG. 3, the time-skew extractor circuit 300 may be configured to extract time-skew values for a 4-channel interleaved ADC (e.g., such as the interleaved ADC 200 of FIG. 2). However, in actual implementations, the time-skew extractor circuit 300 can be configured to extract time-skew values for an interleaved ADC having any number (n) of channels.

The time-skew extractor circuit 300 includes a first subtractor 302, a plurality of second subtractors $304_1$-$304_4$ (hereinafter collectively referred to as "second subtractors 304"), a flip-flop 303, a bit manipulator 310, a demultiplexer 320, and a plurality of averaging circuits $330_0$-$330_4$ (hereinafter collectively referred to as "averaging circuits 330"). In the example of FIG. 3, only four second subtractors 304 and five averaging circuits 330 are shown for simplicity. However, in actual implementations, the time-skew extractor circuit 300 may include any number of second subtractors 304 and/or averaging circuits 330 (e.g., to extract time-skew measurements for an n-channel interleaved ADC).

The first subtractor 302 and flip-flop 303 may be coupled to receive a series of offset/gain calibrated digital samples V(t) captured by an interleaved ADC (such as the output 202 of the interleaved ADC 200). Thus, the samples V(t) may correspond to digital representations of an input signal (such as the input signal 201 received by the interleaved ADC 200) at discrete times t. In some embodiments, the time-skew extractor circuit 300 may determine the differences between the times t in which the digital samples V(t) are acquired based at least in part on the values of V(t). More specifically, the time-skew extractor circuit 300 may be configured to detect distances between consecutive samples V(t) captured by adjacent channels (e.g., channel "pairs") of the interleaved ADC.

The flip-flop 303 may output a derivative V(t+1) of each sample V(t) (e.g., the sample received and/or measured on the next or subsequent clock cycle as the current sample), and may forward the derivative V(t+1) to the first subtractor 302. The first subtractor 302 may perform signal differentiation to obtain the distances ΔV between each consecutive pair of samples (e.g., ΔV=V(t)−V(t+1)). The distances ΔV may be forwarded to a bit manipulator 310, which is configured to manipulate the bits of ΔV to produce the absolute values of the distances |ΔV| (e.g., by flipping a bit representing whether the distance has a positive or negative value). The absolute values |ΔV| are forwarded to the demultiplexer 320 and a first averaging circuit $330_0$.

The first averaging circuit $330_0$ may calculate an average μ(ΔV) of all of the distances |ΔV| output by the bit manipulator 310. More specifically, the average μ(ΔV) output by the first averaging circuit $330_0$ may represent an average of the distances between consecutive samples taken across all of the channels (e.g., CH1-CH4) of the interleaved ADC. This average μ(ΔV) may be provided as an input to each of the second subtractors 304.

The demultiplexer 320 may separate the distances |ΔV| according to their respective channel pairings. For example, a first output $|\Delta V_{t1-t2}|$ of the demultiplexer 320 may correspond to a distance between consecutive samples captured by a first pair of adjacent channels (e.g., CH1 and CH2) of the interleaved ADC, a second output $|\Delta V_{t2-t3}|$ of the demultiplexer 320 may correspond to a distance between consecutive samples captured by a second pair of channels (e.g., CH2 and CH3) of the interleaved ADC, a third output $|\Delta V_{t3-t4}|$ of the demultiplexer 320 may correspond to a distance between consecutive samples captured by a third pair of channels (e.g., CH3 and CH4) of the interleaved ADC, and a fourth output $|\Delta V_{t4-t1}|$ of the demultiplexer 320 may correspond to a distance between consecutive samples captured by a fourth pair of channels (e.g., CH4 and CH1) of the interleaved ADC. The outputs $|\Delta V_{t1-t2}|$, $|\Delta V_{t2-t3}|$, $|\Delta V_{t3-t4}|$, and $|\Delta V_{t4-t1}|$ of the demultiplexer 320 may be provided as inputs to the averaging circuits $330_1$-$330_4$, respectively.

Each of the averaging circuits $330_1$-$330_4$ may calculate an average distance between consecutive samples from a corresponding pair of channels. For example, the second averaging circuit $330_1$ may calculate an average distance $\mu(\Delta V_{t1-t2})$ between consecutive samples captured by the first pair of channels (CH1 and CH2), the third averaging circuit $330_2$ may calculate an average distance $\mu(\Delta V_{t2-t3})$ between consecutive samples captured by the second pair of channels (CH2 and CH3), the fourth averaging circuit $330_3$ may calculate an average distance $\mu(\Delta V_{t3-t4})$ between consecutive samples captured by the third pair of channels (CH3 and CH4), and the fifth averaging circuit $330_4$ may calculate an average distance $\mu(\Delta V_{t4-t1})$ between consecutive samples captured by the fourth pair of channels (CH4 and CH1). The outputs $\mu(\Delta V_{t1-t2})$, $\mu(\Delta V_{t2-t3})$, $\mu(\Delta V_{t3-t4})$, and $\mu(\Delta V_{t4-t1})$ of the averaging circuits $330_1$-$330_4$ may be provided as secondary inputs to each of the second subtractors 304.

Each of the second subtractors 304 may calculate a difference between the average μ(ΔV) of the distances between consecutive samples, as measured across all of the channels (e.g., CH1-CH4) of the interleaved ADC, and the average distance between consecutive samples from a corresponding pair of channels (e.g., CH1-CH2, CH2-CH3, CH3-CH4, or CH4-CH1). The difference computed by each of the second subtractors 304 is proportional to an average time skew α(Δt) between the corresponding pair channels. For example, the first of the second subtractors $304_1$ may calculate a difference between μ(ΔV) and $\mu(\Delta V_{t1-t2})$ to determine an average time skew $\alpha(-\Delta t_1+\Delta t_2)$ between the first pair of channels (CH1 and CH2), the second of the second subtractors $304_2$ may calculate a difference between μ(ΔV) and $\mu(\Delta V_{t2-t3})$ to determine an average time skew $\alpha(-\Delta t_2+\Delta t_3)$ between the second pair of channels (CH2 and CH3), the third of the second subtractors $304_3$ may calculate a difference between μ(ΔV) and $\mu(\Delta V_{t3-t4})$ to determine an average time skew $\alpha(-\Delta t_3+\Delta t_4)$ between the third pair of channels (CH3 and CH4), and the fourth of the second subtractors $304_4$ may calculate a difference between μ(ΔV) and $\mu(\Delta V_{t4-t1})$ to determine an average time skew $\alpha(-\Delta t_4+\Delta t_1)$ between the fourth pair of channels (CH4 and CH1).

The calculated time skew values $\alpha(-\Delta t_1+\Delta t_2)$, $\alpha(-\Delta t_2+\Delta t_3)$, $\alpha(-\Delta t_3+\Delta t_4)$, and $\alpha(-\Delta t_4+\Delta t_1)$ may be provided as inputs to a calibration loop controller (not shown for simplicity), which may be configured to perform time-skew correction at the sampling stage of the interleaved ADC (e.g., as described above with respect to FIG. 2). Ideally, the average distances between consecutive samples from each pair of channels $\mu(\Delta V_{t1-t2})$, $\mu(\Delta V_{t2-t3})$, $\mu(\Delta V_{t3-t4})$, and $\mu(\Delta V_{t4-t1})$ should converge to the average distance across all of the pairs of channels μ(ΔV) following subsequent iterations of time-skew correction. However, noise and/or interference in the communications channel may cause the average distances $\mu(\Delta V_{t1-t2})$, $\mu(\Delta V_{t2-t3})$, $\mu(\Delta V_{t3-t4})$, and $\mu(\Delta V_{t4-t1})$ to diverge as a result of the time-skew adjustments implemented by the calibration loop controller. This, in turn, may affect the accuracy of the time skews $\alpha(-\Delta t_1+\Delta t_2)$, $\alpha(-\Delta t_2+\Delta t_3)$, $\alpha(-\Delta t_3+\Delta t_4)$, and $\alpha(-\Delta t_4+\Delta t_1)$, and thus further hinder the ability of the calibration loop controller to correct for time-skew mismatch.

Figure 4:
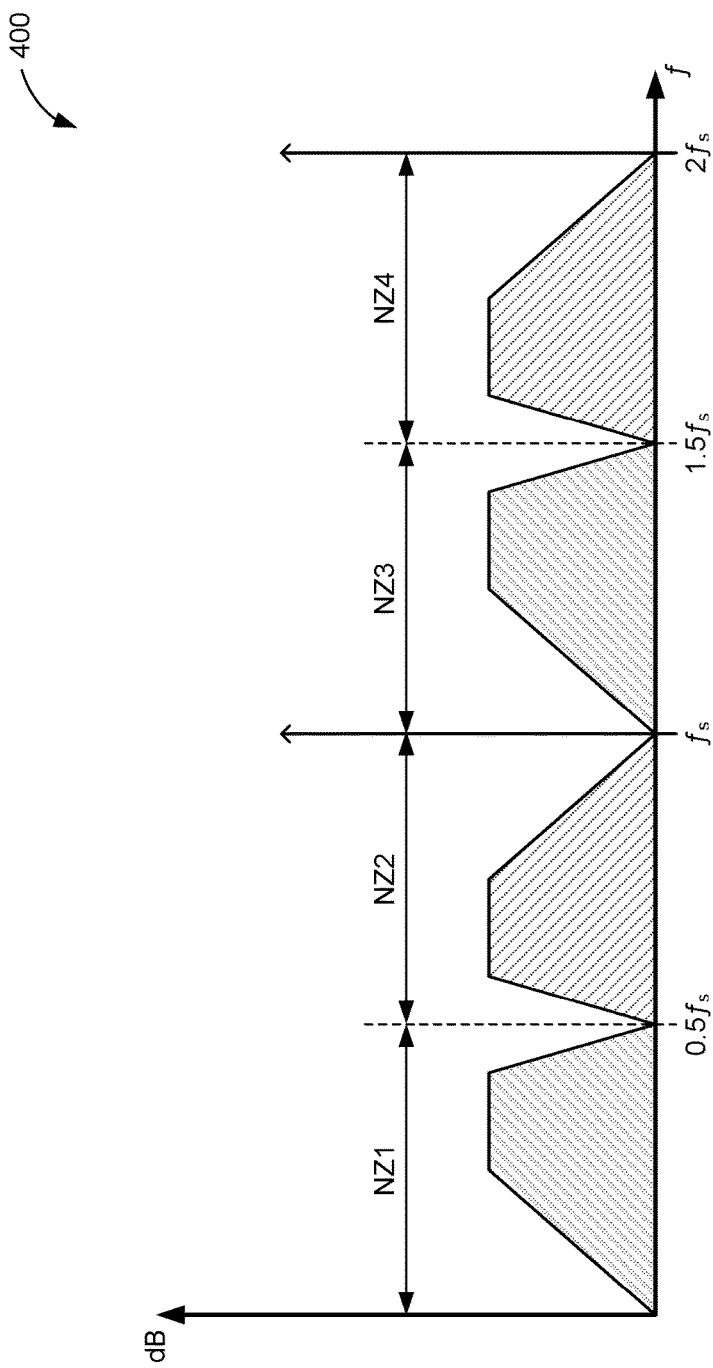
FIG. 4 shows a graph depicting an example aliasing of input signals sampled by an interleaved ADC.

FIG. 4 shows a graph 400 depicting an example aliasing of input signals sampled by an interleaved ADC. In the example of FIG. 4, an input signal may be sampled at a particular sampling frequency $f_s$. Aliasing occurs when the sampling frequency is less than twice the maximum frequency of the input signal (also known as the "Nyquist rate"). As a result of aliasing, the input signal may be associated with any of a plurality of Nyquist zones delineated by the sampling frequency $f_s$. With reference for example to FIG. 4, the sampling frequency $f_s$ defines a number of Nyquist zones NZ1-NZ4. The first Nyquist zone NZ1 spans the frequency range 0 to $0.5f_s$, the second Nyquist zone NZ2 spans the frequency range $0.5f_s$ to $f_s$, the third Nyquist zone NZ3 spans the frequency range $f_s$ to $1.5f_s$, and the fourth Nyquist zone NZ4 spans the frequency range $1.5f_s$ to $2f_s$.

As shown in FIG. 4, input signals located in higher Nyquist zones will alias down to the first Nyquist zone NZ1. Thus, regardless of which Nyquist zone the input signal is actually located in, all of the information contained in the original signal can be found in the first Nyquist zone NZ1. It is noted, however, that the spectrum is reversed for even-numbered Nyquist zones than for odd-numbered Nyquist zones. For example, the frequency components of an input signal located in the second Nyquist zone may be presented in reverse order when sampled in the first Nyquist zone.

Figure 5A:
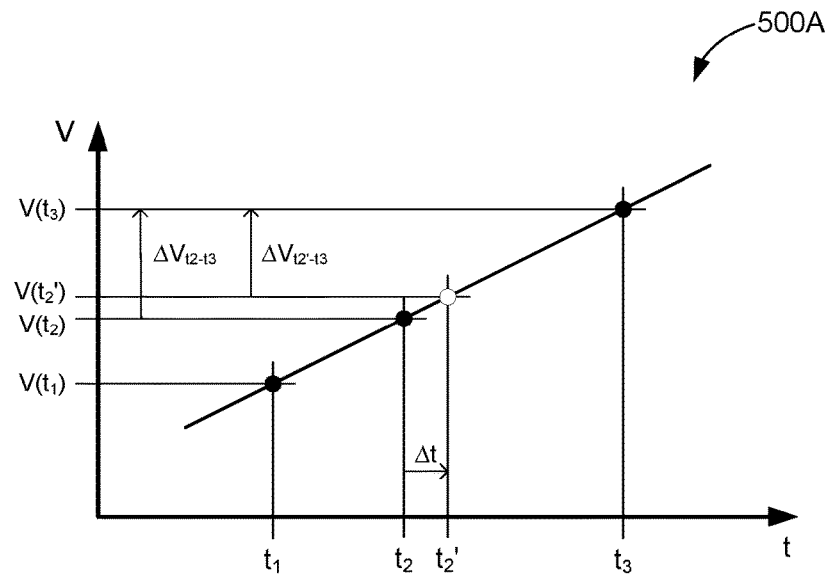
FIG. 5A shows a graph depicting an example sampling of an input signal in an odd Nyquist zone.

FIG. 5A shows a graph 500A depicting an example sampling of an input signal in an odd Nyquist zone. For example, the input signal may be associated with the first Nyquist zone NZ1 of FIG. 1. The input signal may be sampled at discrete times $t_1$, $t_2$, and $t_3$ to produce respective digital samples $V(t_1)$, $V(t_2)$, and $V(t_3)$. In some embodiments, each of the digital samples $V(t_1)$, $V(t_2)$, and $V(t_3)$ may be generated by a respective channel (e.g., slice) of an interleaved ADC. For example, the first sample $V(t_1)$ may be generated by a first channel, the second sample $V(t_2)$ may be generated by a second channel, and the third sample $V(t_3)$ may be generated by a third channel. As shown in FIG. 5A, a time-skew adjustment Δt applied to the second channel causes a change in the distance between the samples generated by the second channel and the samples generated by each of the first and third channels. More specifically, the time-skew adjustment Δt moves the sample generated by the second channel closer to the sample generated by the third channel (e.g., $\Delta V_{t2'-t3} < \Delta V_{t2-t3}$). In other words, the time-skew adjustment Δt causes a reduction in the distance between consecutive samples from the second and third channels of the interleaved ADC.

Figure 5B:
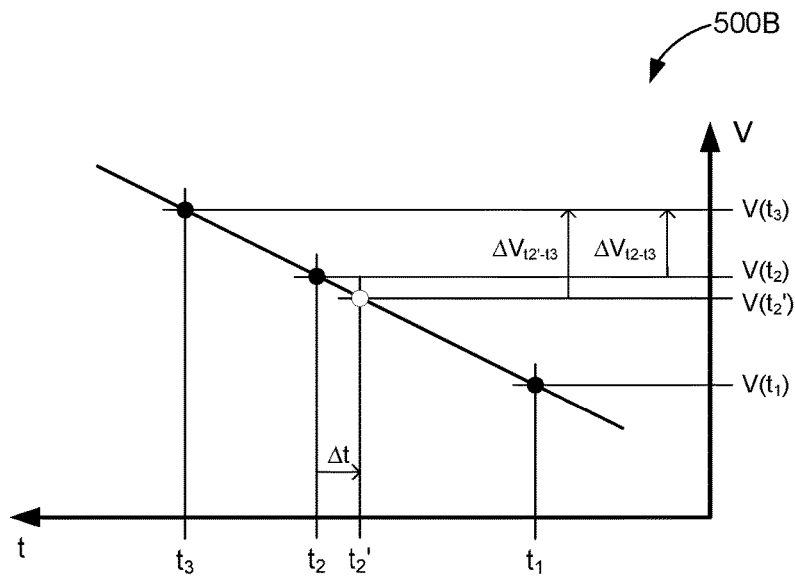
FIG. 5B shows a graph depicting an example sampling of an input signal in an even Nyquist zone.

FIG. 5B shows a graph 500B depicting an example sampling of an input signal in an even Nyquist zone. The input signal of FIG. 5B may be the same as the input signal of FIG. 5A, except that the input signal may be sampled with respect to an adjacent Nyquist zone (such as the second Nyquist zone NZ2 of FIG. 1). Thus, the digital samples $V(t_1)$, $V(t_2)$, and $V(t_3)$ are shown in reverse order from their counterparts in the graph 500A. As shown in FIG. 5B, a time-skew adjustment Δt applied to the second channel causes a change in the distance between the samples generated by the second channel and the samples generated by each of the first and third channels. More specifically, the time-skew adjustment Δt moves the sample generated by the second channel further from the sample generated by the third channel (e.g., $\Delta V_{t2'-t3} > \Delta V_{t2-t3}$). In other words, the time-skew adjustment Δt causes an increase in the distance between consecutive samples from the second and third channels of the interleaved ADC.

It is noted, with respect to FIGS. 5A and 5B, that the Nyquist zone associated with the input signal may affect the polarity of the change in distance between consecutive samples from a given pair of channels. With reference for example to the graph 600 of FIG. 6, a time-skew adjustment Δt in the interleaved ADC may result in a negative (−) polarity of change in the average distance between consecutive samples from the second and third channels (e.g., $\mu'_{odd} < \mu$) when the input signal is sampled with respect to an odd Nyquist zone. On the other hand, the same time time-skew adjustment Δt may result in a positive (+) polarity of change in the average distance between consecutive samples from the second and third channels (e.g., $\mu'_{even} > \mu$) when the input signal is sampled with respect to an even Nyquist zone.

Figure 6:
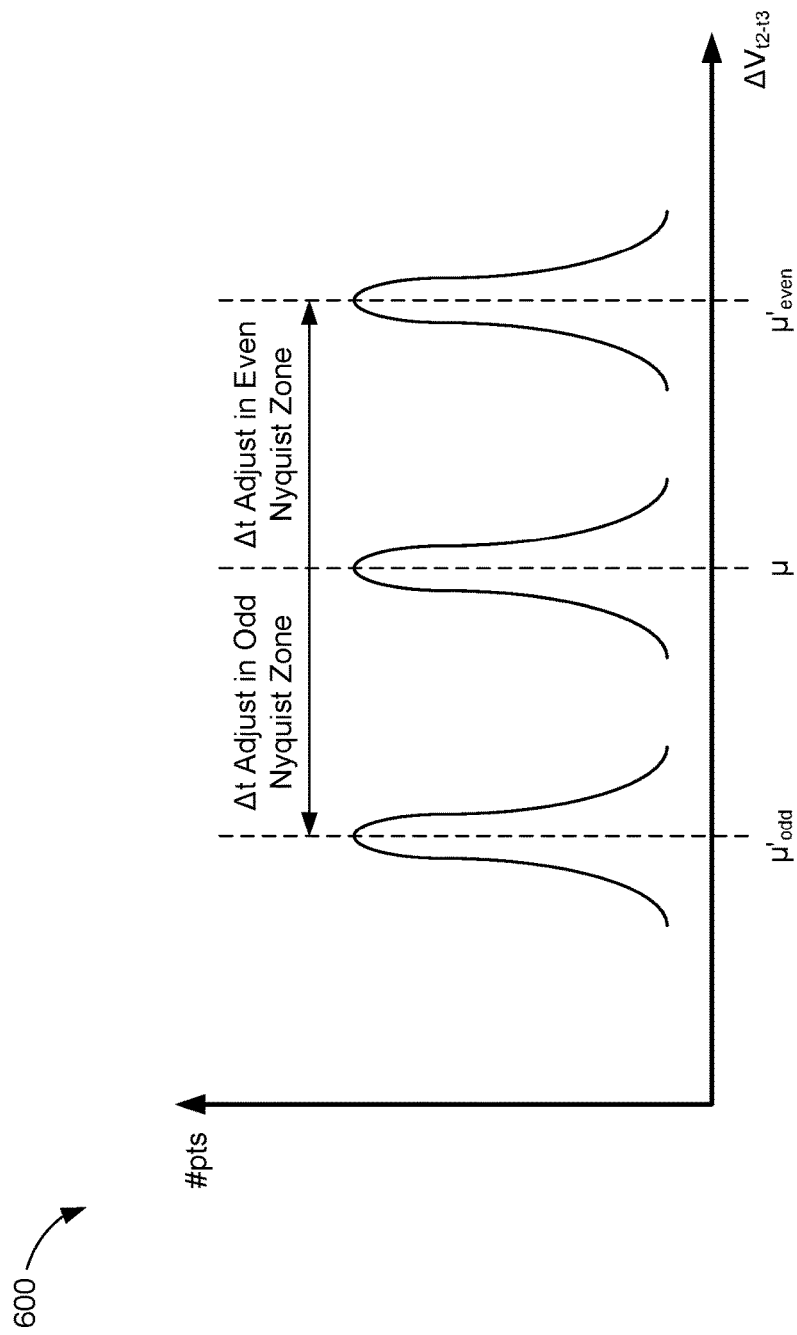
FIG. 6 shows a graph depicting an expected change in the average distance between consecutive samples from a pair of channels of an interleaved ADC in response to time-skew adjustments associated with odd and even Nyquist zones.
Figure 7A:
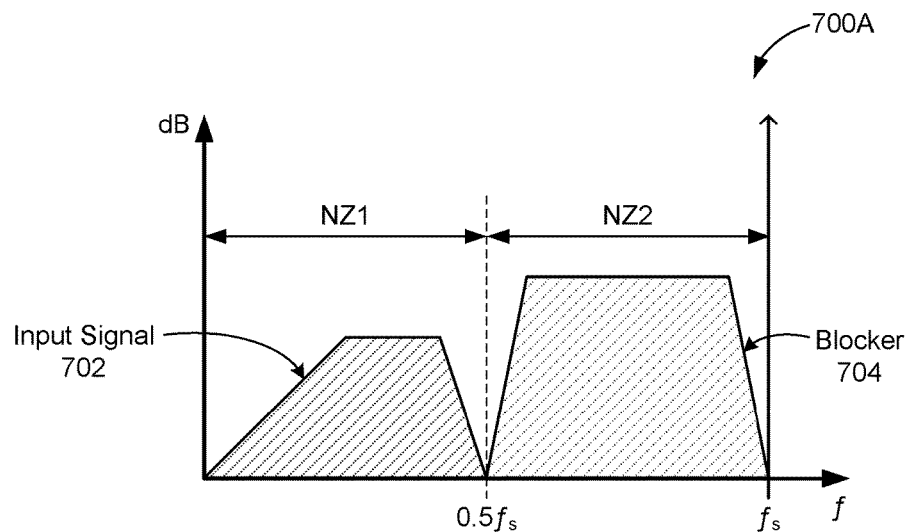
FIG. 7A shows a graph depicting an example aliasing of an input signal in a first Nyquist zone with a high-power blocker in an adjacent Nyquist zone.

In some aspects, the presence of blockers in a particular Nyquist zone may affect the sampling of an input signal in an adjacent Nyquist zone. For example, FIG. 7A shows a graph 700A depicting an example aliasing of an input signal 702 in a first Nyquist zone with a high-power blocker 704 in an adjacent Nyquist zone. In the example of FIG. 7A, the blocker 704 has significantly more power and/or energy than the input signal 702. As a result, the energy sampled by the ADC may be dominated by the blocker 704 in the second Nyquist zone NZ2. As described above with respect to FIG. 6, the polarity of change in the average distance between consecutive samples from a pair of channels (e.g., in response to a time-skew adjustment Δt) may depend on whether the input signal is sampled with respect to an even or odd Nyquist zone.

Figure 7B:
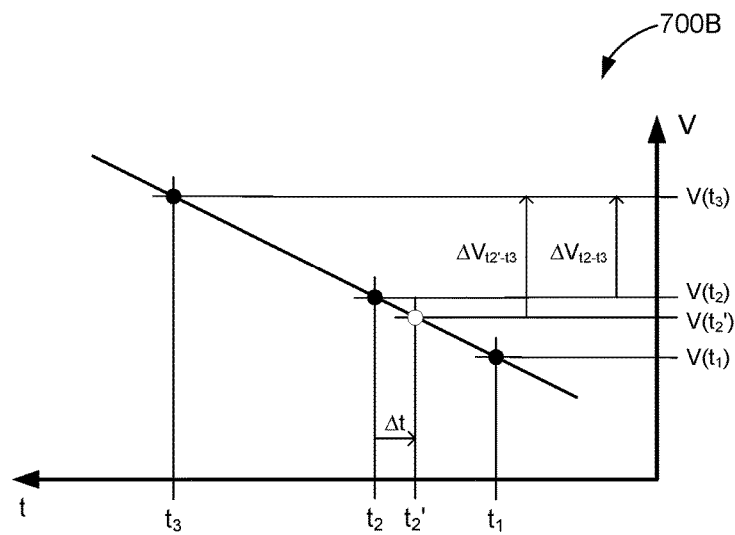
FIG. 7B shows a graph depicting an example sampling of the input signal shown in FIG. 7A as a result of time-skew adjustment.

FIG. 7B shows a graph 700B depicting an example sampling of the input signal shown in FIG. 7A as a result of time-skew adjustment. In the example of FIG. 7B, the sample generated by the second channel $V(t_2)$ is closer to the sample generated by the first channel $V(t_1)$ than to the sample generated by the third channel $V(t_3)$. Since the input signal 702 is located in an odd Nyquist zone (e.g., NZ1), a time-skew adjustment Δt applied to the interleaved ADC is expected to reduce the distance between consecutive samples generated by the second and third channels (such as shown in FIG. 5A). However, because significantly more energy (e.g., from the blocker 704) is located in the second Nyquist zone, the time-skew adjustment Δt may instead increase the distance between consecutive samples generated by the second and third channels (e.g., $\Delta V_{t2'-t3} > \Delta V_{t2-t3}$). This further reduces the accuracy of subsequent digital samples acquired by the second channel of the interleaved ADC.

As shown in FIGS. 7A and 7B, spectral noise and/or interference (e.g., blockers) in a Nyquist zone adjacent the Nyquist zone of the input signal may affect the accuracy of time-skew measurements performed by a time-skew extraction circuit (e.g., such as the time-skew extraction circuit 300 of FIG. 3). For example, because the input signal 702 is expected to be in an odd Nyquist zone, the time-skew extraction circuit may detect that the timing of the second sample occurs too early (e.g., closer to the timing of the first sample than the timing of the third sample). As a result, the calibration loop controller may delay the sample timing of the second channel (e.g., by Δt) in an attempt to correct the time-skew mismatch. However, because the majority of the energy sampled by the interleaved ADC is located in an even Nyquist zone, delaying the sample timing of the second channel may cause the timing of the second sample to occur even earlier. Through feedback, the time skew detected by the time-skew extraction circuit may continue to diverge.

Figure 8:
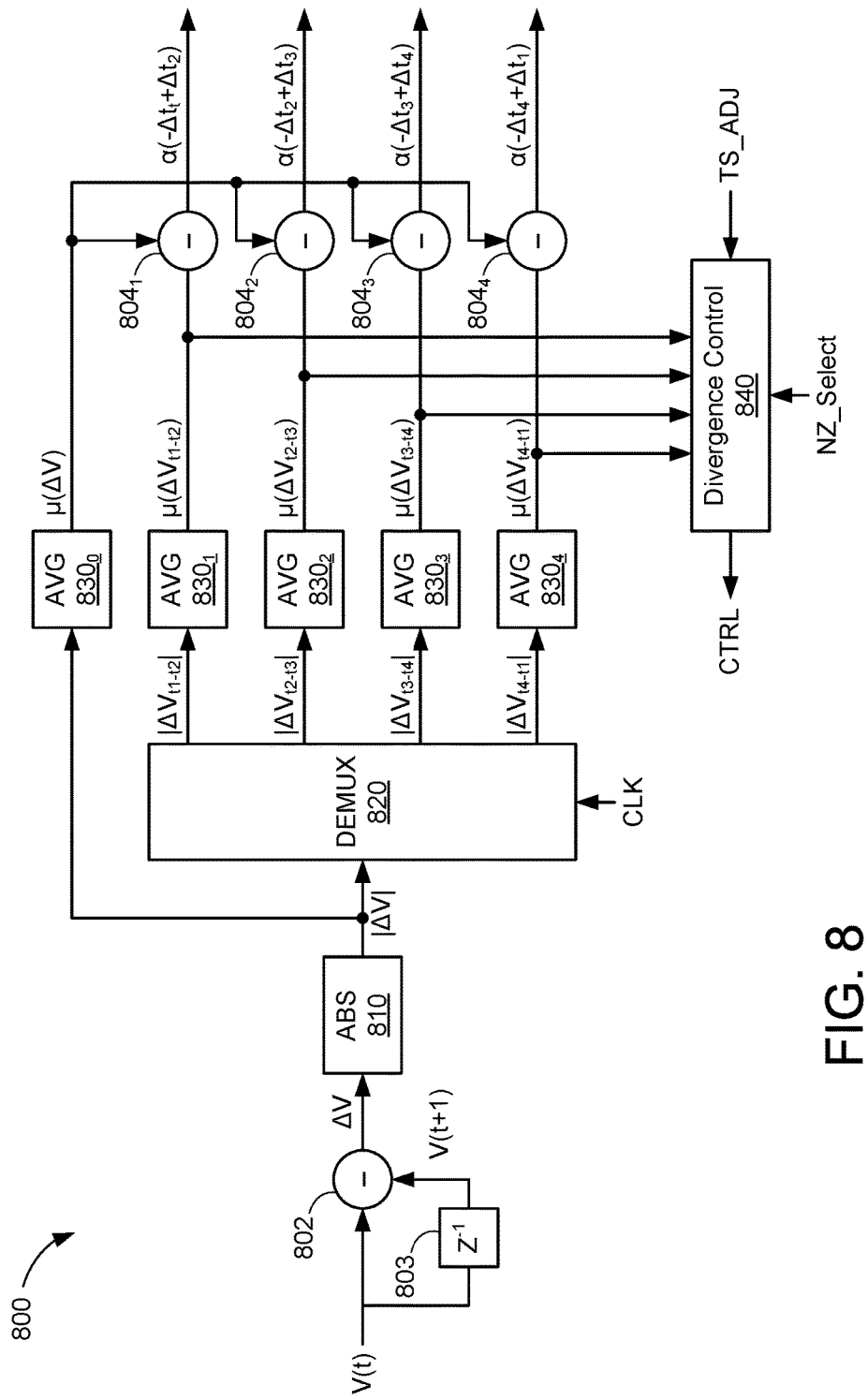
FIG. 8 shows an example block diagram of a time-skew extractor circuit with divergence control circuitry, in accordance with some embodiments.

FIG. 8 shows an example block diagram of a time-skew extractor circuit 800 with divergence control circuitry, in accordance with some embodiments. The time-skew extractor circuit 800 may be an example embodiment of at least a portion of the time-skew adjustment circuit 230 of FIG. 2. For example, the time-skew extractor circuit 800 may be configured to extract time-skew values for a 4-channel interleaved ADC (e.g., such as the interleaved ADC 200 of FIG. 2). However, in actual implementations, the time-skew extractor circuit 300 can be configured to extract time-skew values for an interleaved ADC having any number (n) of channels.

The time-skew extractor circuit 800 includes a first subtractor 802, a plurality of second subtractors $304_1$-$304_4$ (hereinafter collectively referred to as "second subtractors 804"), a flip-flop 803, a bit manipulator 810, a demultiplexer 820, and a plurality of averaging circuits $830_0$-$830_4$ (hereinafter collectively referred to as "averaging circuits 830"). In the example of FIG. 8, only four second subtractors 304 and five average circuits 830 are shown for simplicity. However, in actual implementations, the time-skew extractor circuit 800 may include any number of second subtractors 804 and/or averaging circuits 830 (e.g., to extract time-skew measurements for an n-channel interleaved ADC).

The first subtractors 802 and flip-flop 803 may be coupled to receive a series of offset/gain calibrated digital samples V(t) captured by an interleaved ADC (such as the output 202 of the interleaved ADC 200). Thus, the samples V(t) may correspond to digital representations of an input signal (such as the input signal 201 received by the interleaved ADC 200) at discrete times t. In some embodiments, the time-skew extractor circuit 800 may determine the differences between the times t in which the digital samples V(t) are acquired based at least in part on the values of V(t). More specifically, the time-skew extractor circuit 800 may be configured to detect distances between consecutive samples V(t) captured by adjacent channels (or pairs of channels) of the interleaved ADC.

The flip-flop 803 may output a derivative V(t+1) of each sample V(t) (e.g., the sample received and/or measured on the next or subsequent clock cycle as the current sample), and may forward the derivative V(t+1) to the first subtractor 802. The first subtractor 802 may perform signal differentiation to obtain the distances ΔV between each consecutive pair of samples (e.g., ΔV=V(t)−V(t+1)). The distances ΔV may be forwarded to a bit manipulator 810, which is configured to manipulate the bits of ΔV to produce the absolute values of the distances |ΔV| (e.g., by flipping a bit representing whether the distance has a positive or negative value). The absolute values |ΔV| are forwarded to the demultiplexer 820 and a first averaging circuit $830_0$.

The first averaging circuit $830_0$ may calculate an average μ(ΔV) of all of the distances |ΔV| output by the bit manipulator 810. More specifically, the average μ(ΔV) output by the first averaging circuit $830_0$ may represent an average of the distances between consecutive samples taken across all of the channels (e.g., CH1-CH4) of the interleaved ADC. This average μ(ΔV) may be provided as an input to each of the second subtractors 804.

The demultiplexer 820 may separate the distances |ΔV| according to their respective channel pairings. For example, a first output $|\Delta V_{t1-t2}|$ of the demultiplexer 820 may correspond to a distance between consecutive samples captured by a first pair of adjacent channels (e.g., CH1 and CH2) of the interleaved ADC, a second output $|\Delta V_{t2-t3}|$ of the demultiplexer 820 may correspond to a distance between consecutive samples captured by a second pair of channels (e.g., CH2 and CH3) of the interleaved ADC, a third output $|\Delta V_{t3-t4}|$ of the demultiplexer 820 may correspond to a distance between consecutive samples captured by a third pair of channels (e.g., CH3 and CH4) of the interleaved ADC, and a fourth output $|\Delta V_{t4-t1}|$ of the demultiplexer 820 may correspond to a distance between consecutive samples captured by a fourth pair of channels (e.g., CH4 and CH1) of the interleaved ADC. The outputs $|\Delta V_{t1-t2}|$, $|\Delta V_{t2-t3}|$, $|\Delta V_{t3-t4}|$, and $|\Delta V_{t4-t1}|$ of the demultiplexer 820 may be provided as inputs to the averaging circuits $830_1$-$830_4$, respectively.

Each of the averaging circuits $830_1$-$830_4$ may calculate an average distance between consecutive samples from a corresponding pair of channels. For example, the second averaging circuit $830_1$ may calculate an average distance $\mu(\Delta V_{t1-t2})$ between consecutive samples captured by the first pair of channels (CH1 and CH2), the third averaging circuit $830_2$ may calculate an average distance $\mu(\Delta V_{t2-t3})$ between consecutive samples captured by the second pair of channels (CH2 and CH3), the fourth averaging circuit $830_3$ may calculate an average distance $\mu(\Delta V_{t3-t4})$ between consecutive samples captured by the third pair of channels (CH3 and CH4), and the fifth averaging circuit $830_4$ may calculate an average distance $\mu(\Delta V_{t4-t1})$ between consecutive samples captured by the fourth pair of channels (CH4 and CH1). The outputs $\mu(\Delta V_{t1-t2})$, $\mu(\Delta V_{t2-t3})$, $\mu(\Delta V_{t3-t4})$, and $\mu(\Delta V_{t4-t1})$ of the averaging circuits $830_1$-$830_4$ may be provided as secondary inputs to each of the second subtractors 804.

Each of the second subtractors 804 may calculate a difference between the average μ(ΔV) of the distances between consecutive samples, as measured across all of the channels (e.g., CH1-CH4) of the interleaved ADC, and the average distance between consecutive samples from a corresponding pair of channels (e.g., CH1-CH2, CH2-CH3, CH3-CH4, or CH4-CH1). The difference computed by each of the second subtractors 804 is proportional to an average time skew α(Δt) between the corresponding pair channels. For example, the first of the second subtractors 8041 may calculate a difference between μ(ΔV) and $\mu(\Delta V_{t1-t2})$ to determine an average time skew $\alpha(-\Delta t_1+\Delta t_2)$ between the first pair of channels (CH1 and CH2), the second of the second subtractors 8042 may calculate a difference between μ(ΔV) and $\mu(\Delta V_{t2-t3})$ to determine an average time skew $\alpha(-\Delta t_2+\Delta t_3)$ between the second pair of channels (CH2 and CH3), the third of the second subtractors 8043 may calculate a difference between μ(ΔV) and $\mu(\Delta V_{t3-t4})$ to determine an average time skew $\alpha(-\Delta t_3+\Delta t_4)$ between the third pair of channels (CH3 and CH4), and the fourth of the second subtractors $804_4$ may calculate a difference between μ(ΔV) and $\mu(\Delta V_{t4-t1})$ to determine an average time skew $\alpha(-\Delta t_4+\Delta t_1)$ between the fourth pair of channels (CH4 and CH1).

The calculated time skew values $\alpha(-\Delta t_1+\Delta t_2)$, $\alpha(-\Delta t_2+\Delta t_3)$, $\alpha(-\Delta t_3+\Delta t_4)$, and $\alpha(-\Delta t_4+\Delta t_1)$ may be provided as inputs to a calibration loop controller (not shown for simplicity), which may be configured to perform time-skew correction at the sampling stage of the interleaved ADC (e.g., as described above with respect to FIG. 2). Ideally, the average distances between consecutive samples from each pair of channels $\mu(\Delta V_{t1-t2})$, $\mu(\Delta V_{t2-t3})$, $\mu(\Delta V_{t3-t4})$, and $\mu(\Delta V_{t4-t1})$ should converge to the average distance across all of the pairs of channels μ(ΔV) following subsequent iterations of time-skew correction. However, noise and/or interference in the communications channel may cause the average distances $\mu(\Delta V_{t1-t2})$, $\mu(\Delta V_{t2-t3})$, $\mu(\Delta V_{t3-t4})$, and $\mu(\Delta V_{t4-t1})$ to diverge as a result of the time-skew adjustments implemented by the calibration loop controller.

In some embodiments, the time-skew extractor circuit 800 may include a divergence control circuit 840 to determine an accuracy of the time skews $\alpha(-\Delta t_1+\Delta t_2)$, $\alpha(-\Delta t_2+\Delta t_3)$, $\alpha(-\Delta t_3+\Delta t_4)$, and $\alpha(-\Delta t_4+\Delta t_1)$. More specifically, the divergence control circuit 840 may detect one or more conditions (such as a presence of spectral interference in an adjacent Nyquist zone) that are likely to cause the average distances $\mu(\Delta V_{t1-t2})$, $\mu(\Delta V_{t2-t3})$, $\mu(\Delta V_{t3-t4})$, and $\mu(\Delta V_{t4-t1})$ to diverge. For example, the divergence control circuit 840 may receive a copy of each of the average distances $\mu(\Delta V_{t1-t2})$, $\mu(\Delta V_{t2-t3})$, $\mu(\Delta V_{t3-t4})$, and $\mu(\Delta V_{t4-t1})$ output by the averaging circuits $830_1$-$830_4$, respectively. In some embodiments, the divergence control circuit 840 may monitor trends in the average distances $\mu(\Delta V_{t1-t2})$, $\mu(\Delta V_{t2-t3})$, $\mu(\Delta V_{t3-t4})$, and $\mu(\Delta V_{t4-t1})$ to determine whether a divergence condition has been detected.

As described above with respect to FIGS. 6 and 7, a divergence condition may occur when the energy sampled by the interleaved ADC is dominated by spectral interference (e.g., a blocker) in a Nyquist zone adjacent to the Nyquist zone of the input signal. For example, if the input signal is in an odd Nyquist zone (e.g., NZ1) and a high-power blocker is in an adjacent even Nyquist zone (e.g., NZ2), the energy from the blocker may cause one or more of the average distances $\mu(\Delta V_{t1-t2})$, $\mu(\Delta V_{t2-t3})$, $\mu(\Delta V_{t3-t4})$, and/or $\mu(\Delta V_{t4-t1})$ to increase, in response to a time-skew adjustment Δt, when the average distance is expected to decrease (e.g., as shown in FIG. 6). Similarly, if the input signal is in an even Nyquist zone (e.g., NZ2) and a high-power blocker is in an adjacent odd Nyquist zone (e.g., NZ1), the energy from the blocker may cause one or more of the average distances $\mu(\Delta V_{t1-t2})$, $\mu(\Delta V_{t2-t3})$, $\mu(\Delta V_{t3-t4})$, and/or $\mu(\Delta V_{t4-t1})$ to decrease, in response to a time-skew adjustment Δt, when the average distance is expected to increase (e.g., as shown in FIG. 6).

Thus, in some embodiments, the divergence control circuit 840 may determine an expected polarity of change in the average distances $\mu(\Delta V_{t1-t2})$, $\mu(\Delta V_{t2-t3})$, $\mu(\Delta V_{t3-t4})$, and $\mu(\Delta V_{t4-t1})$ given the Nyquist zone associated with the input signal. In some aspects, the Nyquist zone associated with the input signal may be provided (e.g., as an NZ_Select signal) by a user of the time-skew extraction circuit 800. For example, if the expected polarity of change is negative (−), the divergence control circuit 840 may expect to see a reduction in one or more of the average distances $\mu(\Delta V_{t1-t2})$, $\mu(\Delta V_{t2-t3})$, $\mu(\Delta V_{t3-t4})$, and/or $\mu(\Delta V_{t4-t1})$ in response to a time-skew adjustment $\Delta t$. On the other hand, if the expected polarity of change is positive (+), the divergence control circuit 840 may expect to see an increase in one or more of the average distances $\mu(\Delta V_{t1-t2})$, $\mu(\Delta V_{t2-t3})$, $\mu(\Delta V_{t3-t4})$, and/or $\mu(\Delta V_{t4-t1})$ in response to the same time-skew adjustment $\Delta t$.

In some embodiments, the divergence control circuit 840 may further receive a time-skew adjustment (TS_ADJ) signal from a calibration loop controller. For example, the time-skew adjustment signal may be used to apply a delay or timing offset to one or more channels of the interleaved ADC (such as described with respect to the TS_ADJ signal 203 of FIG. 2). The divergence control circuit 840 may determine, based on the TS_ADJ signal, which (if any) of the channels of the interleaved ADC is to be adjusted for time-skew mismatch. The divergence control circuit 840 may then monitor the selected channel(s) to ensure that the resulting change in average distance associated with that channel has the same polarity as the expected polarity for the selected Nyquist zone.

In a particular example, an input signal may be associated with an odd Nyquist zone. Based on the time-skews $\alpha(-\Delta t_1+\Delta t_2)$, $\alpha(-\Delta t_2+\Delta t_3)$, $\alpha(-\Delta t_3+\Delta t_4)$, and $\alpha(-\Delta t_4+\Delta t_1)$ calculated by the time-skew extraction circuit 800, a calibration loop controller may apply a time-skew adjustment $\Delta t$ to the second channel of the interleaved ADC. As a result of this time-skew adjustment $\Delta t$, the divergence control circuit 840 may expect to detect a decrease in the average distance $\mu(\Delta V_{t2-t3})$ between the second and third channels of the interleaved ADC (e.g., because the input signal is in an odd Nyquist zone). Thus, if the divergence control circuit 840 detects that the average distance $\mu(\Delta V_{t2-t3})$ decreases after applying the time-skew adjustment $\Delta t$, the divergence control circuit 840 may take no further action (e.g., the time-skew detection operation is working properly). However, if the divergence control circuit 840 detects that the average distance $\mu(\Delta V_{t2-t3})$ increases as a result of the time-skew adjustment $\Delta t$, the divergence control circuit 840 may generate a control (CTRL) signal to take corrective action (e.g., a divergence condition is detected).

In some embodiments, the CTRL signal may be used to pause or suspend an operation of the time-skew extraction circuit 800. As described above, the divergence condition may be triggered when the presence of blockers in the ADC causes an incorrect change in polarity of one or more of the average distances $\mu(\Delta V_{t1-t2})$, $\mu(\Delta V_{t2-t3})$, $\mu(\Delta V_{t3-t4})$, and/or $\mu(\Delta V_{t4-t1})$, thus causing the average distances to diverge. Thus, it may be desirable to prevent further divergence by pausing one or more components of the time-skew extraction circuit 800 (e.g., and thereby pausing the time-skew adjustments to the interleaved ADC). It is noted that the presence of blockers (and/or other interference) may be temporary. Thus, in some aspects, the time-skew extraction circuit 800 may re-enable the operation of the time-skew extraction circuit 800 when the blockers are no longer detected in the adjacent Nyquist zone.

In some other embodiments, the CTRL signal may be used to pause or suspend an operation of the interleaved ADC. As described above, the divergence condition may be triggered when a time-skew adjustment $\Delta t$ pushes the sampling time of a particular channel of the interleaved ADC further in the wrong direction (e.g., as shown in FIG. 7B). Thus, the resulting samples of the input signal captured by that particular channel may be even less accurate than they were prior to the time-skew adjustment $\Delta t$. Thus, it may be desirable to prevent further sampling of the input signal by pausing one or more components of the interleaved ADC (e.g., since the resulting time-skew mismatch may have rendered the samples unusable). It is noted that the presence of blockers (and/or other interference) may be temporary. Thus, in some aspects, the time-skew extraction circuit 800 may re-enable the operation of the interleaved ADC when the blockers are no longer detected in the adjacent Nyquist zone.

Still further, in some embodiments, the divergence control circuit 840 may be used to determine the Nyquist zone associated with the input signal. For example, if the divergence control circuit 840 has no a priori knowledge of which Nyquist zone the input signal is located in, the divergence control circuit 840 may determine the associated Nyquist zone based on the detected polarity of change in one or more of the average distances $\mu(\Delta V_{t1-t2})$, $\mu(\Delta V_{t2-t3})$, $\mu(\Delta V_{t3-t4})$, and/or $\mu(\Delta V_{t4-t1})$. More specifically, the divergence control circuit 840 may determine the Nyquist zone associated with the input signal by monitoring how the interleaved ADC responds to a time-skew adjustment $\Delta t$. For example, the divergence control circuit 840 may determine whether the input signal is located in an odd or even Nyquist zone based on the polarity of change in the average distance between consecutive samples from a particular pair of channels in response to a given time-skew adjustment $\Delta t$.

In the example above, if the divergence control circuit 840 detects a reduction in the average distance $\mu(\Delta V_{t2-t3})$ after applying a time-skew adjustment $\Delta t$ to the second channel of the interleaved ADC, then the divergence control circuit 840 may determine that the input signal is located in an odd Nyquist zone (e.g., assuming there are no high-power blockers in an adjacent Nyquist zone). On the other hand, if the divergence control circuit 840 detects an increase in the average distance $\mu(\Delta V_{t2-t3})$ after applying the time-skew adjustment $\Delta t$ to the second channel of the interleaved ADC, then the divergence control circuit 840 may determine that the input signal is located in an even Nyquist zone (e.g., assuming there are no high-power blockers in an adjacent Nyquist zone).

It is noted that, when determining the Nyquist zone associated with the input signal, the divergence control circuit 840 may assume that there are no high-power blockers (e.g., in an adjacent Nyquist zone) being sampled by the ADC. In some embodiments, the divergence control circuit 840 may initially assume that the input signal is located in a particular Nyquist zone (e.g., for purposes of executing the time-skew extraction operation), and may correct the initial assumption after detecting how the interleaved ADC responds to a time-skew adjustment $\Delta t$.

Figure 9:
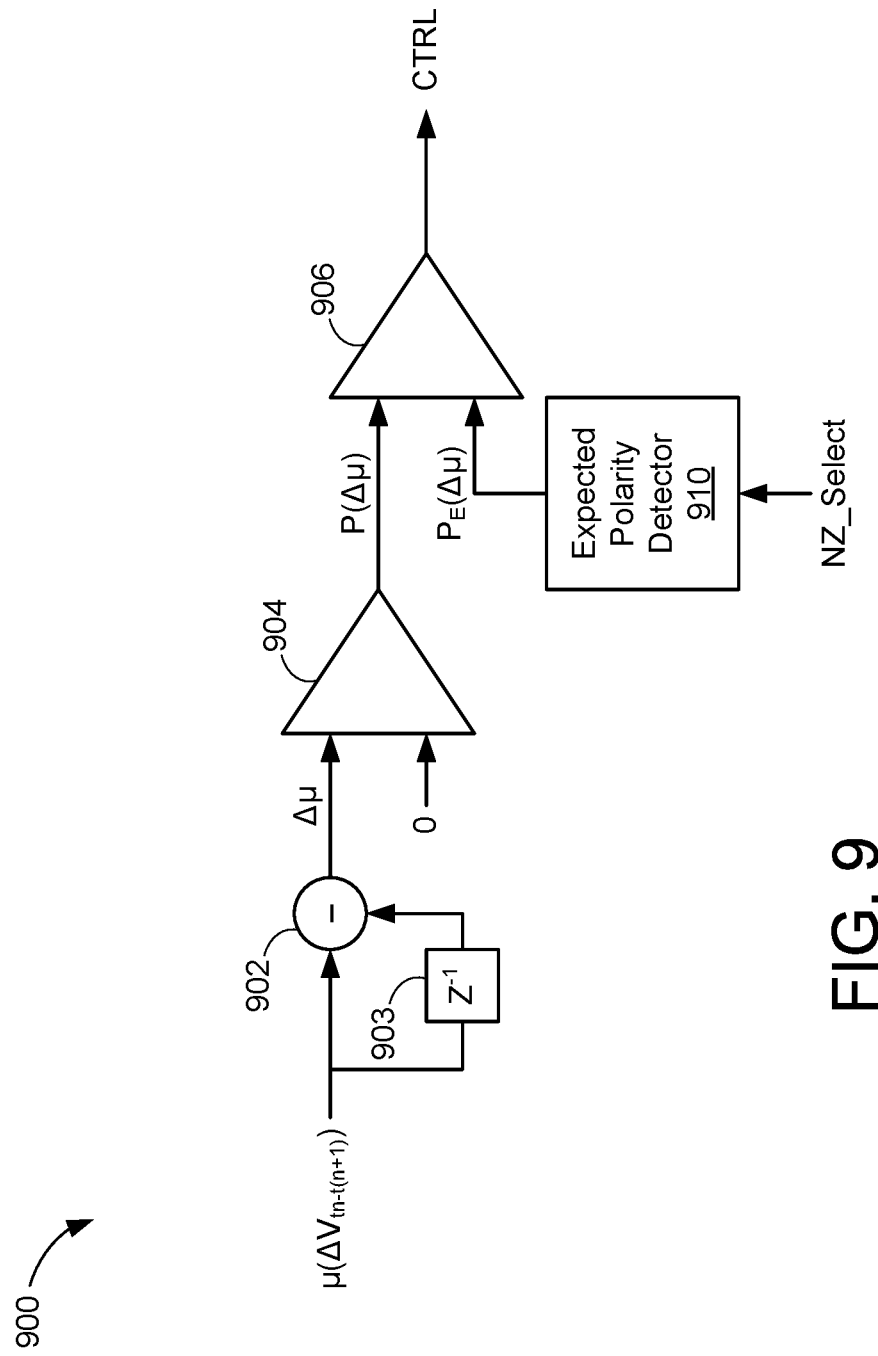
FIG. 9 shows an example block diagram of a divergence control circuit, in accordance with some embodiments.

FIG. 9 shows an example block diagram of a divergence control circuit 900, in accordance with some embodiments. The divergence control circuit 900 may be an example embodiment of the divergence control circuit 840 of FIG. 8. Thus, the divergence control circuit 900 may be used to detect a divergence condition when operating a time-skew extraction circuit (such as the time-skew extraction circuit 800). In the example of FIG. 9, the divergence control circuit 900 is shown to include circuitry for detecting a divergence condition between a particular pair of channels (e.g., channels n and n+1). However, in actual implementations, the divergence control circuit 900 may be configured to detect divergence conditions between any number of adjacent channels (e.g., in parallel).

The divergence control circuit 900 includes a subtractor 902, a flip-flop 803, a first comparator 904, a second comparator 906, and an expected polarity detector 910. The subtractor 902 and flip-flop 903 may be coupled to receive a series of average distances $\mu(\Delta V_{tn-t(n+1)})$ between consecutive samples taken by a pair of adjacent channels of an interleaved ADC (such as the outputs of one or more of the averaging circuits 830 of FIG. 8). Thus, the average distance $\mu(\Delta V_{tn-t(n+1)})$ may be proportional to the amount of time-skew calculated by a corresponding time-skew extraction circuit (such as the time-skew extraction circuit 800 of FIG. 8) between a pair of adjacent channels. In some embodiments, the divergence control circuit 900 may be configured to determine an accuracy of the time-skews calculated by the time-skew extraction circuit. More specifically, the divergence control circuit 900 may be configured to detect whether a polarity of change in the average distance $\mu(\Delta V_{tn-t(n+1)})$ is proper given the Nyquist zone associated with the input signal.

The flip-flop 903 may output a derivative of each average distance $\mu(\Delta V_{tn-t(n+1)})$ (e.g., the average distance between subsequent samples, captured after at least some of the samples used to determine the current average distance). The subtractor 902 may perform signal differentiation to determine a change in average distance $\Delta\mu$ over time. The change in average distance $\Delta\mu$ may be provided as a first input to the first comparator 904. More specifically, the first comparator 904 may compare the change in average distance $\Delta\mu$ with a reference value (e.g., "0") to determine the polarity $P(\Delta\mu)$ of the change in average distance. For example, the first comparator 904 may output a "0" or a "1" depending on whether the change in average distance $\Delta\mu$ is greater than, or less than, the reference value (e.g., $P(\Delta\mu)=0$ if $\Delta\mu<0$; and $P(\Delta\mu)=1$ if $\Delta\mu>0$). Thus, if the average distance $\mu(\Delta V_{tn-t(n+1)})$ decreases over time, the first comparator 904 may output a first value to indicate a negative polarity of change (e.g., $P(\Delta\mu)=0$). On the other hand, if the average distance $\mu(\Delta V_{tn-t(n+1)})$ increases over time, the first comparator 904 may output a second value to indicate a positive polarity of change (e.g., $P(\Delta\mu)=1$).

In some embodiments, the expected polarity detector 910 may determine an expected polarity $P_E(\Delta\mu)$ of change in the average distance given the Nyquist zone associated with the input signal. For example, the expected polarity detector 910 may output a "0" or a "1" depending on the Nyquist zone associated with the input signal. In some aspects, the Nyquist zone associated with the input signal may be provided (e.g., as an NZ_Select signal) by a user of the divergence control circuit 900. In some other aspects, the divergence control circuit 900 may initially assume a Nyquist zone for the input signal. As described above, the polarity of change associated with an odd Nyquist zone may be opposite the polarity of change associated with an even Nyquist zone (e.g., as shown in FIG. 6). For example, if the input signal is located in an odd Nyquist zone, the expected polarity detector 910 may output a first value to indicate a negative polarity of change (e.g., $P_E(\Delta\mu)=0$). On the other hand, if the input signal is located in an even Nyquist zone, the expected polarity detector 910 may output a second value to indicate a positive polarity of change (e.g., $P_E(\Delta\mu)=1$).

The second comparator 906 may be coupled to receive the outputs of the first comparator 904 and the expected polarity detector 910. More specifically, the second comparator 906 may compare the expected polarity of change $P_E(\Delta\mu)$ with the actual polarity of change $P(\Delta\mu)$ to determine the accuracy of the time-skews measured by the time-skew extraction circuit (e.g., whether a divergence condition is present in the interleaved ADC). In some embodiments, the second comparator 906 may selectively output a control (CTRL) signal based at least in part on the comparison. For example, the second comparator 906 may output a "0" or a "1" depending on whether the expected polarity of change $P_E(\Delta\mu)$ is the same as the actual polarity of change $P_E(\Delta\mu)$. In some embodiments, the divergence control circuit 900 may be configured to take no further action if the polarity $P(\Delta\mu)$ of the change in average distance is the same as the expected polarity of change $P_E(\Delta\mu)$. Thus, the second comparator 906 may deassert the CTRL signal (e.g., CTRL=0) if the expected polarity of change is the same as the actual polarity of change (e.g., $P_E(\Delta\mu)=P(\Delta\mu)$)

In some other embodiments, the divergence control circuit 900 may be configured to take corrective action (e.g., using the CTRL signal) if the polarity $P(\Delta\mu)$ of the change in average distance is different than the expected polarity of change $P_E(\Delta\mu)$. Thus, the second comparator 906 may assert the CTRL signal (e.g., CTRL=1) if the expected polarity of change is not the same as the expected polarity of change (e.g., $P_E(\Delta\mu) \neq P(\Delta\mu)$). In some aspects, the asserted CTRL signal may be used to pause or suspend an operation of the time-skew extraction circuit (such as the time-skew extraction circuit 800 of FIG. 8). In some other aspects, the asserted CTRL signal may be used to pause or suspend an operation of the interleaved ADC (such as the sampling stage 210 of FIG. 2).

Figure 10:
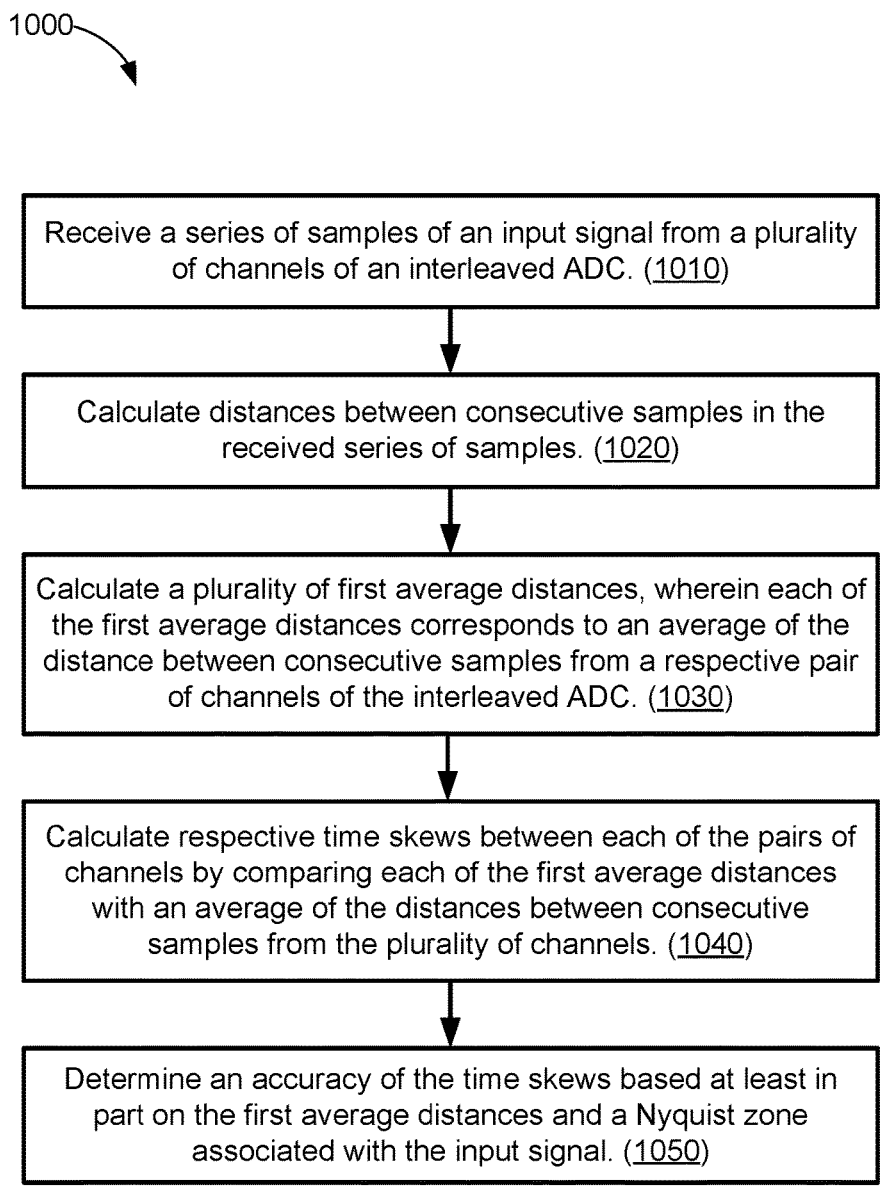
FIG. 10 is an illustrative flow chart depicting an example operation for detecting time-skew divergence in an interleaved ADC, in accordance with some embodiments.

FIG. 10 is an illustrative flow chart depicting an example operation 1000 for detecting time-skew divergence in an interleaved ADC, in accordance with some embodiments. Although described below with respect to the time-skew extraction circuit 800 of FIG. 8, the example operation 1000 may be performed by any suitable time-skew extraction circuit.

The time-skew extraction circuit 800 receives a series of samples of an input signal from a plurality of channels of an interleaved ADC (1010). For example, the received samples V(t) may correspond to digital representations of an input signal captured at a plurality of discrete instances of time t. In some implementations, the received samples may be offset/gain calibrated digital samples (such as output by the offset/gain calibration circuit 220 of FIG. 2).

The time-skew extraction circuit 800 may calculate distances between consecutive samples in the received series of samples (1020). For example, the flip-flop 803 may output a derivative V(t+1) of each sample V(t), and may forward the derivative V(t+1) to a first subtractor 802. The first subtractor 802 may then perform signal differentiation to obtain the distances $\Delta V$ between each consecutive pair of samples (e.g., $\Delta V=V(t)-V(t+1)$). In some embodiments, the distances $\Delta V$ may be forwarded to a bit manipulator 810, which is configured to manipulate the bits of $\Delta V$ to produce the absolute values of the distances $|\Delta V|$ (e.g., by flipping a bit representing whether the distance has a positive or negative value).

The time-skew extraction circuit 800 may further calculate a plurality of first average distances, wherein each of the first average distances corresponds to an average of the distance between consecutive samples from a respective pair of channels of the interleaved ADC (1030). For example, the demultiplexer 820 may separate the distances $|\Delta V|$ according to their respective channel pairings. The outputs $|\Delta V_{t1-t2}|$, $|\Delta V_{t2-t3}|$, $|\Delta V_{t3-t4}|$, and $|\Delta V_{t4-t1}|$ of the demultiplexer 820 may then be provided as inputs to the averaging circuits $830_1$-$830_4$, respectively. Each of the averaging circuits $830_1$-$830_4$ may calculate an average distance between consecutive samples from a corresponding pair of channels.

The time-skew extraction circuit 800 may then calculate respective time skews between each of the pairs of channels by comparing each of the first average distances with an average of the distances between consecutive samples from the plurality of channels (1040). For example, the first averaging circuit 830₀ may calculate an average μ(ΔV) of all of the distances |ΔV| output by the bit manipulator 810. More specifically, the average μ(ΔV) output by the first averaging circuit 830₀ may represent an average of the distances between consecutive samples taken across all of the channels of the interleaved ADC. Each of the second subtractors 804 may be coupled to receive the output of the first averaging circuit 830₀ and the output of a respective one of the remaining averaging circuits 830₁-830₄. More specifically, each of the second subtractor 804 may calculate a difference between the average μ(ΔV) of the distances between consecutive samples, as measured across all of the channels of the interleaved ADC, and the average distance between consecutive samples from a corresponding pair of channels. The difference computed by each of the second subtractors 804 is proportional to an average time skew α(Δt) between the corresponding pair channels.

Finally, the time-skew extractor circuit 800 may determine an accuracy of the time skews based at least in part on the first average distances and a Nyquist zone associated with the input signal (1050). For example, the divergence control circuit 840 may detect one or more conditions (such as a presence of spectral interference in an adjacent Nyquist zone) that are likely to cause the average distances μ(ΔV$_{t1-t2}$), μ(ΔV$_{t2-t3}$), μ(ΔV$_{t3-t4}$), and μ(ΔV$_{t4-t1}$) to diverge. In some embodiments, the divergence control circuit 840 may monitor trends in the average distances μ(ΔV$_{t1-t2}$), μ(ΔV$_{t2-t3}$), μ(ΔV$_{t3-t4}$), and μ(ΔV$_{t4-t1}$) to determine whether a divergence condition has been detected. In some aspects, the divergence control circuit 840 may determine an expected polarity of change in the average distances μ(ΔV$_{t1-t2}$), μ(ΔV$_{t2-t3}$), μ(ΔV$_{t3-t4}$), and μ(ΔV$_{t4-t1}$) given the Nyquist zone associated with the input signal. The divergence control circuit 840 may then monitor the average distances μ(ΔV$_{t1-t2}$), μ(ΔV$_{t2-t3}$), μ(ΔV$_{t3-t4}$), and μ(ΔV$_{t4-t1}$) to ensure that the resulting change in average distance associated with a time-skew adjustment Δt has the same polarity as the expected polarity for the selected Nyquist zone.

In some embodiments, if the divergence control circuit 840 detects that the average distance μ(ΔV) between consecutive samples from a particular pair of channels is the same as the expected polarity of change after applying the time-skew adjustment Δt, the divergence control circuit 840 may take no further action (e.g., the time-skew detection operation is working properly). However, if the divergence control circuit 840 detects that the average distance μ(ΔV) between consecutive samples from a particular pair of channels is different than the expected polarity of change as a result of the time-skew adjustment Δt, the divergence control circuit 840 may generate a control (CTRL) signal to take corrective action (e.g., a divergence condition is detected). In some aspects, the CTRL signal may be used to pause or suspend an operation of the time-skew extraction circuit 800. In some other aspects, the CTRL signal may be used to pause or suspend an operation of the interleaved ADC.

Figure 11:
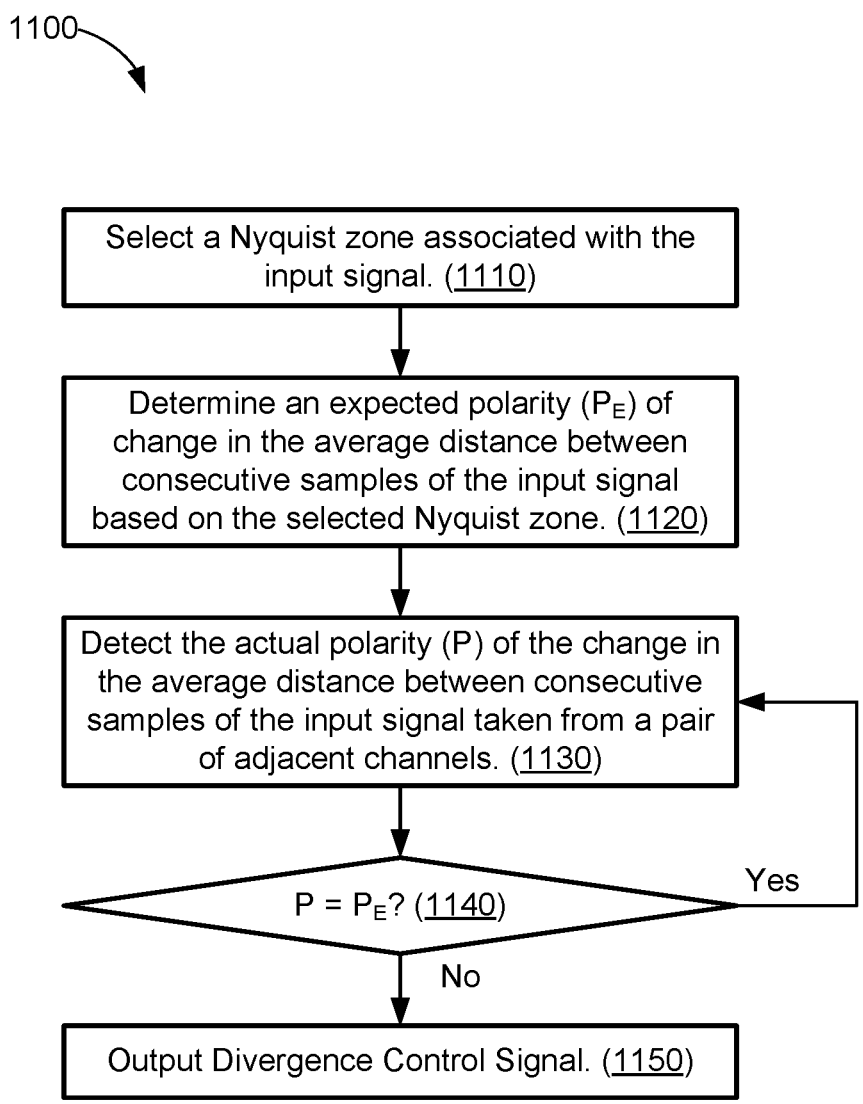
FIG. 11 is an illustrative flow chart depicting an example operation for controlling time-skew divergence when adjusting for time skew in an interleaved ADC, in accordance with some embodiments.

FIG. 11 is an illustrative flow chart depicting an example operation for controlling time-skew divergence when adjusting for time skew in an interleaved ADC, in accordance with some embodiments. Although described below with respect to the divergence control circuit 900 of FIG. 9, the example operation 1100 may be performed by any suitable divergence control circuit.

The divergence control circuit 900 may first select a Nyquist zone associated with the input signal (1110). In some embodiments, the selected Nyquist zone may be provided by a user of the divergence control circuit 900 (or the interleaved ADC). In some other embodiments, the selected Nyquist zone may be based on an initial assumption by the divergence control circuit 900 (e.g., assuming no a priori knowledge of the actual Nyquist zone associated with the input signal by the divergence control circuit 900).

The divergence control circuit 900 may then determine an expected polarity (P$_E$) of change in the average distance between consecutive samples of the input signal based on the selected Nyquist zone (1120). As described above, the polarity of change associated with an odd Nyquist zone may be opposite the polarity of change associated with an even Nyquist zone (e.g., as shown in FIG. 6). For example, if the input signal is located in an odd Nyquist zone, the expected polarity detector 910 may output a first value to indicate a negative polarity of change (e.g., P$_E$=0). On the other hand, if the input signal is located in an even Nyquist zone, the expected polarity detector 910 may output a second value to indicate a positive polarity of change (e.g., P$_E$=1).

The divergence control circuit 900 may also detect the actual polarity (P) of the change in the average distance between consecutive samples of the input signal taken from a pair of adjacent channels (1130). For example, the subtractor 902 and flip-flop 903 may be coupled to receive a series of average distances μ(ΔV$_{m-t(n+1)}$) between consecutive samples taken by a pair of adjacent channels of an interleaved ADC. The flip-flop 903 may output a derivative of each average distance μ(ΔV$_{m-t(n+1)}$) (e.g., the average distance between subsequent samples, captured after at least some of the samples used to determine the current average distance). The subtractor 902 may perform signal differentiation to determine a change in average distance Δμ over time. The first comparator 904 may then compare the change in average distance Δμ with a reference value (e.g., "0") to determine the polarity P of the change in average distance. For example, the first comparator 904 may output a "0" or a "1" depending on whether the change in average distance Δμ is greater than, or less than, the reference value (e.g., P=0 if Δμ<0; and P=1 if Δμ>0).

The divergence control circuit 900 may then compare the expected polarity P$_E$ with the actual polarity P of the change in average distance between consecutive samples from a pair of adjacent channels (1140). For example, the second comparator 906 may compare the expected polarity of change P$_E$ with the actual polarity of change P to determine the accuracy of the time-skews measured by the time-skew extraction circuit (e.g., whether a divergence condition is present in the interleaved ADC). If the actual polarity of change P is the same as the expected polarity of change P$_E$ (as tested at 1140), the divergence control circuit 900 may continue to monitor the polarity P of change in the average distance between consecutive samples from adjacent channels (1130) and/or take no further action. In some embodiments, the second comparator 906 may deassert a CTRL signal (e.g., CTRL=0) if the expected polarity of change is the same as the actual polarity of change (e.g., P=P$_E$).

If the actual polarity of change P is different than the expected polarity of change P$_E$ (as tested at 1140), the divergence control circuit 900 may respond by outputting a divergence control signal (1150). For example, the divergence control circuit 900 may be configured to take corrective action when a divergence condition is detected. In some embodiments, the second comparator 906 may assert the CTRL signal (e.g., CTRL=1) if the expected polarity of change is not the same as the actual polarity of change (e.g., $P \neq P_E$). In some aspects, the asserted CTRL signal may be used to pause or suspend an operation of the time-skew extraction circuit (such as the time-skew extraction circuit 800 of FIG. 8). In some other aspects, the asserted CTRL signal may be used to pause or suspend an operation of the interleaved ADC (such as the sampling stage 210 of FIG. 2).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A time-skew adjustment circuit, comprising:
   an input to receive a series of samples of an input signal from a plurality of channels of an interleaved analog-to-digital converter (ADC);
   a first subtractor to calculate distances between consecutive samples in the received series of samples;
   a plurality of averaging circuits to calculate a plurality of first average distances, wherein each of the first average distances corresponds to an average of the distance between consecutive samples from a respective pair of channels of the interleaved ADC;
   time-skew detection circuitry to calculate respective time skews between each of the pairs of channels by comparing each of the first average distances with an average of the distances between consecutive samples from the plurality of channels; and
   divergence control circuitry to determine an accuracy of the time skews based at least in part on the first average distances and a Nyquist zone associated with the input signal.

2. The time-skew adjustment circuit of claim 1, further comprising:
   a calibration loop controller to selectively apply a timing offset to one or more channels of the interleaved ADC based at least in part on the time skews.

3. The time-skew adjustment circuit of claim 2, wherein the divergence control circuitry is configured to:
   determine the accuracy of the time skew calculated for a first pair of channels of the interleaved ADC based at least in part on a first timing offset applied by the calibration loop controller to at least one of the channels in the first pair.

4. The time-skew adjustment circuit of claim 3, wherein the divergence control circuitry is further configured to:
   calculate a change in the first average distance for the first pair of channels in response to the first timing offset; and
   determine the accuracy of the time skew calculated for the first pair of channels based at least in part on a polarity of the change in the first average distance for the first pair of channels.

5. The time-skew adjustment circuit of claim 4, wherein the divergence control circuitry is further configured to:
   determine the Nyquist zone associated with the input signal based at least in part on the polarity of the change in the first average distance for the first pair of channels.

6. The time-skew adjustment circuit of claim 4, wherein the divergence control circuitry is further configured to:
   determine an expected polarity of change in the first average distance, in response to the first timing offset, based at least in part on the Nyquist zone associated with the input signal; and
   compare the polarity of the change in the first average distance with the expected polarity of change.

7. The time-skew adjustment circuit of claim 6, wherein the expected polarity of change corresponds to a first polarity when the input signal is associated with an odd Nyquist zone, and wherein the expected polarity of change corresponds to a second polarity when the input signal is associated with an even Nyquist zone.

8. The time-skew adjustment circuit of claim 6, wherein the expected polarity of change corresponds to a reduction in the first average distance when the input signal is associated with an odd Nyquist zone, and wherein the expected polarity of change corresponds to an increase in the first average distance when the input signal is associated with an even Nyquist zone.

9. The time-skew adjustment circuit of claim 6, wherein the divergence control circuitry is further configured to:
   suspend an operation of the interleaved ADC when the polarity of the change in the first average distance is not the same as the expected polarity of change.

10. The time-skew adjustment circuit of claim 6, wherein the divergence control circuitry is further configured to:
    prevent the calibration loop controller from applying the timing offset to one or more channels of the interleaved ADC when the polarity of the change in the first average distance is not the same as the expected polarity of change.

11. A method, comprising:
- receiving a series of samples of an input signal from a plurality of channels of an interleaved analog-to-digital converter (ADC);
- calculating distances between consecutive samples in the received series of samples;
- calculating a plurality of first average distances, wherein each of the first average distances corresponds to an average of the distance between consecutive samples from a respective pair of channels of the interleaved ADC;
- calculating respective time skews between each of the pairs of channels by comparing each of the first average distances with an average of the distances between consecutive samples from the plurality of channels; and
- determining an accuracy of the time skews based at least in part on the first average distances and a Nyquist zone associated with the input signal.

12. The method of claim 11, further comprising:
- selectively applying a timing offset to one or more channels of the interleaved ADC based at least in part on the time skews.

13. The method of claim 12, wherein the determining comprises:
- determining the accuracy of the time skew calculated for a first pair of channels of the interleaved ADC based at least in part on a first timing offset applied to at least one of the channels in the first pair.

14. The method of claim 13, wherein the determining further comprises:
- calculating a change in the first average distance for the first pair of channels in response to the first timing offset; and
- determining the accuracy of the time skew calculated for the first pair of channels based at least in part on a polarity of the change in the first average distance for the first pair of channels.

15. The method of claim 14, further comprising:
- determining the Nyquist zone associated with the input signal based at least in part on the polarity of the change in the first average distance for the first pair of channels.

16. The method of claim 14, wherein the determining further comprises:
- determining an expected polarity of change in the first average distance, in response to the first timing offset, based at least in part on the Nyquist zone associated with the input signal; and
- comparing the polarity of the change in the first average distance with the expected polarity of change.

17. The method of claim 16, wherein the expected polarity of change corresponds to a first polarity when the input signal is associated with an odd Nyquist zone, and wherein the expected polarity of change corresponds to a second polarity when the input signal is associated with an even Nyquist zone.

18. The method of claim 16, wherein the expected polarity of change corresponds to a reduction in the first average distance when the input signal is associated with an odd Nyquist zone, and wherein the expected polarity of change corresponds to an increase in the first average distance when the input signal is associated with an even Nyquist zone.

19. The method of claim 16, further comprising:
- suspending an operation of the interleaved ADC when the polarity of the change in the first average distance is not the same as the expected polarity of change.

20. The method of claim 16, further comprising:
- preventing the calibration loop controller from applying the timing offset to one or more channels of the interleaved ADC when the polarity of the change in the first average distance is not the same as the expected polarity of change.

* * * * *